(12) United States Patent     (10) Patent No.:    US 9,362,106 B2
Iwamoto et al.                     (45) Date of Patent:       Jun. 7, 2016

(54) SUBSTRATE PROCESSING METHOD, SUBSTRATE PROCESSING APPARATUS, AND STORAGE MEDIUM

(71) Applicants: Sony Corporation, Tokyo (JP); Tokyo Electron Limited, Tokyo (JP)

(72) Inventors: Hayato Iwamoto, Tokyo (JP); Yoshiya Hagimoto, Tokyo (JP); Tomoki Tetsuka, Fukuoka (JP); Shinichiro Shimomura, Koshi (JP); Teruomi Minami, Koshi (JP); Hiroki Sakurai, Koshi (JP); Hirotaka Maruyama, Koshi (JP); Yosuke Kawabuchi, Koshi (JP); Hiroshi Tanaka, Koshi (JP)

(73) Assignees: Sony Corporation, Minato-Ku (JP); Tokyo Electron Limited, Minato-Ku (JP)

( * ) Notice: Subject to any disclaimer, the term of this patent is extended or adjusted under 35 U.S.C. 154(b) by 25 days.

(21) Appl. No.: 13/910,249

(22) Filed: Jun. 5, 2013

(65) Prior Publication Data

US 2014/0080312 A1     Mar. 20, 2014

(30) Foreign Application Priority Data

Jun. 8, 2012    (JP) ................................ 2012-130905

(51) Int. Cl.
| | |
|---|---|
| *H01L 21/461* | (2006.01) |
| *H01L 21/02* | (2006.01) |
| *H01L 21/67* | (2006.01) |
| *H01L 21/306* | (2006.01) |

(52) U.S. Cl.
CPC .... *H01L 21/02019* (2013.01); *H01L 21/30608* (2013.01); *H01L 21/6708* (2013.01); *H01L 21/02052* (2013.01)

(58) Field of Classification Search
CPC ..................... H01L 21/30608; H01L 21/6708; H01L 21/02052; H01L 21/02019
USPC ................. 438/748, 749, 750; 216/83, 91, 92
See application file for complete search history.

(56) References Cited

U.S. PATENT DOCUMENTS

| | | | |
|---|---|---|---|
| 2002/0155391 A1* | 10/2002 | Takahashi et al. ............ | 430/322 |
| 2003/0068579 A1 | 4/2003 | Takahashi et al. | |
| 2005/0058944 A1* | 3/2005 | Takahashi et al. ............ | 430/311 |
| 2008/0196742 A1* | 8/2008 | Beck .............................. | 134/1.3 |

(Continued)

FOREIGN PATENT DOCUMENTS

| | | |
|---|---|---|
| JP | 05-094975 A1 | 4/1993 |
| JP | 09-246254 A1 | 9/1997 |
| JP | 10-041262 A1 | 2/1998 |

(Continued)

OTHER PUBLICATIONS

Wikipedia, The Free Encyclopedia, "Atmoshphere of Earth", http://en.wikipedia.org/wiki/Atmosphere_of_Earth ; p. 1-16; 2015.*

*Primary Examiner* — Binh X Tran
(74) *Attorney, Agent, or Firm* — Burr & Brown, PLLC

(57) ABSTRACT

A wafer is held horizontally and rotated by a substrate holding mechanism. An aqueous alkaline solution is supplied to a wafer by a nozzle and caused to flow from a central portion to a peripheral edge portion of the wafer, thereby etching the wafer. An amount of oxygen, which is equal to or more than the amount of oxygen in atmospheric air involved in the aqueous alkaline solution flowing on the wafer, is previously dissolved in the aqueous alkaline solution.

8 Claims, 15 Drawing Sheets

(56) References Cited

U.S. PATENT DOCUMENTS

| | | | |
|---|---|---|---|
| 2009/0023231 A1* | 1/2009 | Ohmi | H01L 21/02074 438/16 |
| 2010/0099036 A1* | 4/2010 | Kawamura et al. | 430/30 |
| 2011/0041871 A1* | 2/2011 | Fan | 134/1 |
| 2013/0306238 A1 | 11/2013 | Miura et al. | |

FOREIGN PATENT DOCUMENTS

| | | |
|---|---|---|
| JP | 2000-279902 A1 | 10/2000 |
| JP | 2000-349063 A1 | 12/2000 |
| JP | 2002-343698 A1 | 11/2002 |
| JP | 2010-062259 A1 | 3/2010 |
| JP | 2013-258391 A1 | 12/2013 |

* cited by examiner

SUBSTRATE PROCESSING METHOD, SUBSTRATE PROCESSING APPARATUS, AND STORAGE MEDIUM

CROSS REFERENCE TO RELATED APPLICATIONS

The present patent application claims the benefit of Japanese Patent Application No. 2012-130905 filed on Jun. 8, 2012. The entire contents of the disclosure in the prior application are incorporated by reference in the present specification.

FIELD OF THE INVENTION

The present invention relates to a substrate processing method of processing a substrate to be processed, a substrate processing apparatus for processing a substrate to be processed, and a storage medium.

BACKGROUND OF THE INVENTION

Generally, manufacturing steps of semiconductors, MEMS, etc., involve etching silicon wafers by using etching solutions. As a method of etching the silicon wafer by the etching solution, alkaline etching that uses an aqueous alkaline solution of, for example, potassium hydroxide (KOH) or tetramethyl ammonium hydroxide (TMAH) has widely been used.

Relevant existent techniques, for example, JP5-94975A and JP9-246254A are cited herein.

The alkaline etching has been performed by supplying an alkaline chemical solution to a central portion of a wafer while holding and rotating the wafer in a sheet type cleaning machine. However, when the alkaline chemical solution is supplied from the central portion of the wafer, the amount of etching is sometimes different between the central portion and a peripheral edge portion of the wafer.

The present invention has been accomplished in view of the foregoing and intends to provide a substrate processing method capable of allowing the amount of etching to be uniformly applied over the area ranging from the central portion to the peripheral edge of the wafer, a substrate processing apparatus, and a storage medium.

SUMMARY OF THE INVENTION

A substrate processing method for processing a substrate to be processed includes: a step of holding the substrate horizontally and rotating the substrate; and a step of supplying an aqueous alkaline solution to the substrate and allowing the aqueous alkaline solution to flow from a central portion to a peripheral edge portion of the substrate, thereby etching the substrate. An amount of oxygen, which is equal to or more than the amount of oxygen in atmospheric air involved in the aqueous alkaline solution flowing on the substrate, is dissolved previously in the aqueous alkaline solution.

In the substrate processing method according to the invention, the concentration of oxygen in the aqueous alkaline solution is preferably 200 ppb to 1000 ppb.

In the substrate processing method according to the invention, the concentration of oxygen in the aqueous alkaline solution is preferably 200 ppb to 500 ppb.

A substrate processing apparatus for processing a substrate to be processed includes: a substrate holding mechanism configured to hold the substrate horizontally and rotating the substrate; a nozzle for supplying an aqueous alkaline solution to the substrate, thereby etching the substrate, thereby etching the substrate; and a liquid supplying mechanism connected to the nozzle, the liquid supplying mechanism supplying to the nozzle an aqueous alkaline solution in which an amount of oxygen, which is equal to or more than the amount of oxygen in atmospheric air involved in the aqueous alkaline solution flowing from a central portion to a peripheral edge portion of the substrate on the substrate, is dissolved.

In the substrate processing apparatus according to the invention, the concentration of oxygen in the aqueous alkaline solution is preferably 200 ppb to 1000 ppb.

In the substrate processing apparatus according to the invention, the concentration of oxygen in the aqueous alkaline solution is preferably 200 ppb to 500 ppb.

In the substrate processing apparatus according to the invention, the liquid supplying mechanism preferably includes: a pure water supplying mechanism for supplying pure water; an oxygen dissolving mechanism connected to the pure water supplying mechanism, the oxygen dissolving mechanism dissolving oxygen in pure water from the pure water supplying mechanism; and a chemical solution supplying mechanism connected to the oxygen dissolving mechanism, the chemical solution supplying mechanism mixing an alkaline chemical solution with pure water in which oxygen is dissolved in the oxygen dissolving mechanism, thereby forming the aqueous alkaline solution.

A storage medium according to the invention is used for a substrate processing method for processing a substrate to be processed and stores a computer program that is operated on a computer. The substrate processing method includes: a step of holding the substrate horizontally and rotating the substrate; and a step of supplying an aqueous alkaline solution to the substrate, thereby etching the substrate. An amount of oxygen, which is equal to or more than the amount of oxygen in atmospheric air involved in the aqueous alkaline solution flowing from a central portion to a peripheral edge portion of the substrate on the substrate, is dissolved previously in the aqueous alkaline solution.

A substrate processing method for processing a substrate to be processed includes: a step of holding the substrate target horizontally and rotating the substrate target; and a step of supplying an aqueous alkaline solution in which oxygen is dissolved previously to the substrate by a nozzle, thereby etching the substrate. The nozzle is movable between each of a first position above the central portion of the substrate, a second position outside of the first position, and a third position outside of the second position. The etching step includes: a first moving supply step of supplying the aqueous alkaline solution to the substrate while moving the nozzle from the second position to the first position; and a second supply step of supplying the alkaline aqueous solution to the substrate after the first moving supply step while moving the nozzle from the third position to the second position.

In the substrate processing method according to the invention, a step of stopping the nozzle for a predetermined period at the third position is preferably provided between the first moving supply step and the second moving supply step.

In the substrate processing method according to the invention, the second moving supply step is preferably performed after performing the first moving supply step by a plurality of times.

In the substrate processing method according to the invention, the second moving supply step is preferably performed by a plurality of times after performing the first moving supply step.

In the substrate processing method according to the invention, a combination of the first moving supply step and the second moving supply step is preferably performed by a plurality of times.

In the substrate processing method according to the invention, the concentration of oxygen in the aqueous alkaline solution is preferably 2500 ppb or more.

A substrate processing apparatus for processing a substrate to be processed according to the invention includes: a substrate holding mechanism configured to hold the substrate horizontally and rotating the substrate; a nozzle for supplying an aqueous alkaline solution to the substrate thereby etching the substrate, the nozzle being movable for a first position above a central portion of the substrate, a second position to the outside of the first position, and a third position to the outside of the second position; a liquid supplying mechanism connected to the nozzle, the liquid supplying mechanism supplying to the nozzle an aqueous alkaline solution in which oxygen is dissolved; and a controller for controlling the nozzle. The controller controls the nozzle so as to supply the aqueous alkaline solution to the substrate while moving the nozzle from the second position to the first position and, subsequently, supply the aqueous alkaline solution to the substrate while moving the nozzle from the third position to the second position.

In the substrate processing apparatus according to the invention, the concentration of oxygen in the aqueous alkaline solution is preferably 2,500 ppb or more.

In the substrate processing apparatus according to the invention, preferably the liquid supplying mechanism includes: a pure water supplying mechanism for supplying pure water; an oxygen dissolving mechanism connected to the pure water supplying mechanism, the oxygen dissolving mechanism dissolving oxygen in pure water from the pure water supplying mechanism; and a chemical solution supplying mechanism connected to the oxygen dissolving mechanism, the chemical solution supplying mechanism mixing an alkaline chemical solution with pure water in which oxygen is dissolved in the oxygen dissolving mechanism, thereby forming the aqueous alkaline solution.

A storage medium according to the invention is used for a substrate processing method of processing a substrate to be processed and stores a computer program that is operated on a computer. The substrate processing method includes a step of holding the substrate horizontally and rotating the substrate, and a step of supplying an aqueous alkaline solution in which oxygen is dissolved previously to the substrate by a nozzle, thereby etching the substrate. The nozzle is movable between each of a first position above the central portion of the substrate, a second position outside to the first position, and a third position outside of the second position. The step of etching the substrate includes a first moving supply step of supplying the aqueous alkaline solution to the substrate while moving the nozzle from the second position to the first position, and a second moving supply step of supplying the aqueous alkaline solution to the substrate while moving the nozzle from the third position to the second position after the first moving supply step.

A substrate processing method for processing a substrate to be processed includes: a step of holding the substrate horizontally and rotating the substrate; and a step of supplying an aqueous alkaline solution to the substrate by at least one nozzle, thereby etching the substrate. The step of etching the substrate includes a first supply step of supplying the aqueous alkaline solution at a first oxygen concentration for a predetermined period to the substrate, and a second supply step of supplying the aqueous alkaline solution at a second oxygen concentration different from the first concentration to the substrate after the first supply step.

In the substrate processing method according to the invention, the first concentration is preferably 100 ppb or less in the first supply step.

In the substrate processing method according to the invention, at least one of a period of supplying the aqueous alkaline solution, a flow rate of the aqueous alkaline solution, a temperature when the aqueous alkaline solution is supplied, and a number of rotation of the substrate is preferably different between the first supply step and the second supply step.

In the substrate processing method according to the invention, the nozzle used in the first supply step and the nozzle used in the second supply step are preferably different from each other.

A substrate processing apparatus for processing a substrate to be processed according to the invention includes: a substrate holding mechanism configured to hold the substrate horizontally and rotating the substrate; at least one nozzle for supplying an aqueous alkaline solution to the substrate, thereby etching the substrate; a liquid supplying mechanism connected to the nozzle, the liquid supplying mechanism supplying to the nozzle an aqueous alkaline solution in which oxygen is dissolved; and a controller for controlling the nozzle. The controller controls the at least one nozzle so as to supply the aqueous alkaline solution at a first oxygen concentration to the substrate and, subsequently, supply the aqueous alkaline solution at a second oxygen concentration different from the first concentration for a predetermined period to the substrate.

In the substrate processing apparatus according to the invention, the first oxygen concentration is preferably 100 ppb or less.

In the substrate processing apparatus according to the invention, the controller is preferably adapted to change at least one of a period of supplying the aqueous alkaline solution, a flow rate of the aqueous alkaline solution, a temperature when the aqueous alkaline solution is supplied, and a number of rotation of the substrate between a case in which the aqueous alkaline solution at the first oxygen concentration is supplied and a case in which the aqueous alkaline solution at the second oxygen concentration is supplied.

In the substrate processing apparatus according to the invention, the at least one nozzle preferably includes a first nozzle for supplying the aqueous alkaline solution at the first oxygen concentration and a second nozzle for supplying the aqueous alkaline solution at the second oxygen concentration.

In the substrate processing apparatus according to the invention, preferably the liquid supplying mechanism includes: a pure water supplying mechanism for supplying pure water; an oxygen dissolving mechanism connected to the pure water supplying mechanism, the oxygen dissolving mechanism dissolving oxygen into pure water from the pure water supplying mechanism; and a chemical solution supplying mechanism connected to the oxygen dissolving mechanism, the chemical solution supplying mechanism mixing an alkaline chemical solution to pure water in which oxygen is dissolved in the oxygen dissolving mechanism, thereby forming the aqueous alkaline solution.

In the substrate processing apparatus according to the invention, the liquid supplying mechanism preferably includes: a reservoir unit for storing the aqueous alkaline solution; and an oxygen supplying mechanism connected to the reservoir unit, the oxygen supplying mechanism supplying oxygen to the aqueous alkaline solution in the reservoir unit, thereby dissolving oxygen.

In the substrate processing apparatus according to the invention, the liquid supplying mechanism further includes preferably an inert gas supplying mechanism connected to the reservoir unit, the inert gas supplying mechanism supplying an inert gas to the aqueous alkaline solution in the reservoir unit.

In the substrate processing apparatus according to the invention, the liquid supplying mechanism preferably has two reservoir units including a first reservoir unit storing the aqueous alkaline solution at a first oxygen concentration and the second reservoir unit storing the aqueous alkaline solution at a second oxygen concentration.

A storage medium according to the invention is used for a substrate processing method for processing a substrate to be processed and stores a computer program that is operated on a computer. The substrate processing method includes: a step of holding the substrate horizontally and rotating the substrate; and a step of supplying an aqueous alkaline solution to the substrate by at least one nozzle, thereby etching the substrate. The step of etching the substrate includes a first supply step of supplying the aqueous alkaline solution at a first oxygen concentration for a predetermined period to the substrate for a predetermined period, and a second supply step of supplying the aqueous alkaline solution at a second oxygen concentration different from the first concentration to the substrate for a predetermined period after the first supply step.

A substrate processing apparatus for processing a substrate to be processed according to the invention includes: a substrate holding mechanism configured to hold the substrate horizontally and rotating the substrate; a nozzle for supplying an aqueous alkaline solution to the substrate, thereby etching the substrate; and a liquid supplying mechanism connected to the nozzle, the liquid supplying mechanism supplying to the nozzle an aqueous alkaline solution in which oxygen is dissolved. The liquid supplying mechanism includes: a reservoir unit for storing the aqueous alkaline solution; and an oxygen supplying mechanism connected to the reservoir unit, the oxygen supplying mechanism supplying oxygen to the aqueous alkaline solution in the reservoir unit, thereby dissolving oxygen.

In the substrate processing apparatus according to the invention, preferably the liquid supplying mechanism further includes an inert gas supplying mechanism connected to the reservoir unit, the inert gas supplying mechanism supplying an inert gas to the aqueous alkaline solution in the reservoir unit.

In the substrate processing apparatus according to the invention, preferably the oxygen supplying mechanism dissolves oxygen into the aqueous alkaline solution in the reservoir unit after the inert gas supplying mechanism has supplied an inert gas to the aqueous alkaline solution in the reservoir unit.

In the substrate processing apparatus according to the invention, preferably the inert gas supplying mechanism supplies the inert gas to the aqueous alkaline solution in the reservoir unit after the liquid supplying mechanism has supplied to the nozzle the aqueous alkaline solution in which oxygen is dissolved.

According to the invention, undesired effect on the etching caused by involution of oxygen in atmospheric air into the aqueous alkaline solution flowing from the central portion to the peripheral edge portion of the wafer can be suppressed, and an etching amount applied from the central portion to the peripheral edge portion of the wafer can be made uniform within the surface of the wafer.

DETAILED DESCRIPTION OF THE INVENTION

First Embodiment

A first embodiment of a substrate processing method, a substrate processing apparatus, and a storage medium according to the invention is to be described with reference to FIG. 1 to FIG. 4.

Configuration of a Substrate Processing Apparatus

Figure 1:
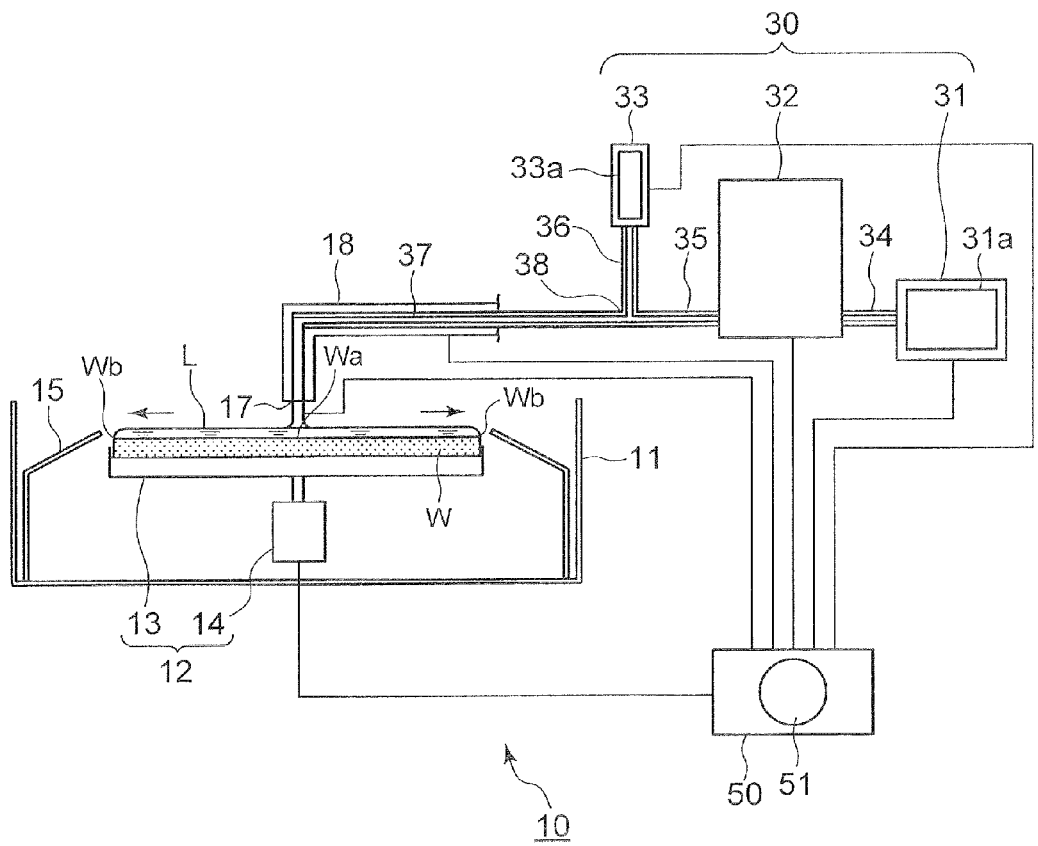
FIG. 1 is a schematic view illustrating a substrate processing apparatus according to a first embodiment of the invention.

First, a configuration of a substrate processing apparatus according to this embodiment is to be described. FIG. 1 is a schematic view illustrating a substrate processing apparatus according to this embodiment.

As illustrated in FIG. 1, a substrate processing apparatus 10 includes a casing 11, a substrate holding mechanism 12 disposed in the casing 11, a nozzle 17 provided above the substrate holding mechanism 12 and a liquid supplying mechanism 30 connected to the nozzle 17.

The substrate holding mechanism 12 has a function of holding a silicon wafer (wafer W) of a disk shape as a substrate to be processed horizontally and rotating the wafer W. The substrate holding mechanism 12 has a placing bed 13 for receiving and holding the wafer W and a rotational mechanism 14 connected to the lower portion of the placing bed 13 and rotating the placing bed 13 around a vertical rotational axis (Z axis). The vertical rotational axis passes through the central portion $W_a$ of the wafer W.

The rotational mechanism 14 is connected to the output of a controller 50 including, for example, a central processing unit (CPU) and adapted to be controlled for the rotational speed by the controller 50. The rotational mechanism 14 may also be adapted to be movable vertically by a not illustrated elevation mechanism.

The outer circumference of the placing bed 13 is covered by a liquid receiving unit 15. The liquid receiving unit 15 is adapted to receive an aqueous alkaline solution L that is shaken off by a centrifugal force and discharge the solution further to the outside during processing.

A nozzle 17 serves to supply the aqueous alkaline solution L to the wafer W held on the substrate holding mechanism 12. The aqueous alkaline solution L supplied from the nozzle 17 to the wafer W flows from a central portion $W_a$ to a peripheral edge portion $W_b$ of the wafer W by a centrifugal force, whereby etching is applied to the wafer W.

The nozzle 17 is connected to the output of the controller 50 described above so as to allow ON/OFF of the nozzle 17 to be controlled. Further, the nozzle 17 is attached at an end of a nozzle arm 18. The nozzle arm 18 is connected to the output of the controller 50 so as to allow movement of the nozzle 17 to be controlled.

The liquid supplying mechanism 30 has a pure water supplying mechanism 31 for supplying pure water, an oxygen dissolving mechanism 32 connected to the pure water supplying mechanism 31, and a chemical solution supplying mechanism 33 connected to the oxygen dissolving mechanism 32.

The pure water control mechanism 31 has a pure water containment tank 31a containing pure water. The pure water supplying mechanism 31 is connected to the output of the controller 50 so as to allow the amount of pure water supplied from the pure water supplying mechanism 31 to be controlled.

The pure water supplying mechanism 31 is connected by way of a supply pipe 34 to the oxygen dissolving mechanism 32. The oxygen dissolving mechanism 32 deaerates pure water and dissolves a predetermined amount of oxygen into the deaerated pure water. The oxygen dissolving mechanism 32 is connected to the output of the controller 50 so as to allow the amount of oxygen dissolved in the oxygen dissolving mechanism 32 to be controlled.

The chemical solution supplying mechanism 33 has a chemical solution containment tank 33a for containing an alkaline chemical solution. The chemical solution supplying mechanism 33 is connected to the output of the controller 50 so as to allow the amount of the alkaline chemical solution supplied from the chemical solution supplying mechanism 33 to be controlled.

The alkaline chemical solution supplied from the chemical solution supplying mechanism 33 is not restricted so long as the solution is an alkali etching solution and, for example, an aqueous solution of potassium hydroxide (KOH), tetramethyl ammonium hydroxide (TMAH), sodium hydroxide (NaOH), aqueous ammonia ($NH_4OH$), choline, or hydrazine can be used.

A supply pipe 36 is connected to the chemical solution supplying mechanism 33. The supply pipe 36 is joined at a junction 38 with the supply pipe 35 extending from the oxygen dissolving mechanism 32. The alkaline chemical solution from the chemical solution supplying mechanism 33 is mixed with pure water (in which oxygen is dissolved) sent from the oxygen dissolving mechanism 32 to form an aqueous alkaline solution L. The aqueous alkaline solution L is supplied from the junction 38 passing through a pipeline 37 to the nozzle 17 and discharged from the nozzle 17 onto the wafer W. The supply pipe 37 is disposed in the nozzle arm 18 described above.

In this embodiment, the controller 50 is adapted to control the liquid supplying mechanism 30 (pure water supplying mechanism 31, oxygen dissolving mechanism 32, and chemical solution supplying mechanism 33) so that an amount of oxygen, which is equal to or more than the amount of oxygen in atmospheric air involved into the aqueous alkaline solution L flowing on the wafer W, is dissolved in the aqueous alkaline solution L supplied from the nozzle 17. Specifically, the controller 50 controls the liquid supplying mechanism 30 such that the concentration of oxygen in the aqueous alkaline solution L is preferably 200 ppb to 1000 ppb and, more preferably, 200 ppb to 500 ppb.

The controller 50 is adapted to perform the substrate processing method to be described later by controlling the substrate processing apparatus. The controller 50 has a storage medium 51 storing a computer program which is operated on a computer and used for the substrate processing method of the wafer W. As the storage medium 51, a memory such as ROM or RAM may be used, or a disk-like medium such as a hard disk or CD-ROM may also be used.

Substrate Processing Method Using Substrate Processing Apparatus

Then, the function of this embodiment comprising such a configuration, specifically, a substrate processing method of using the substrate processing apparatus described above is to be described with reference FIG. 1 and FIG. 2. The following operations are carried out by the controller 50.

Figure 2:
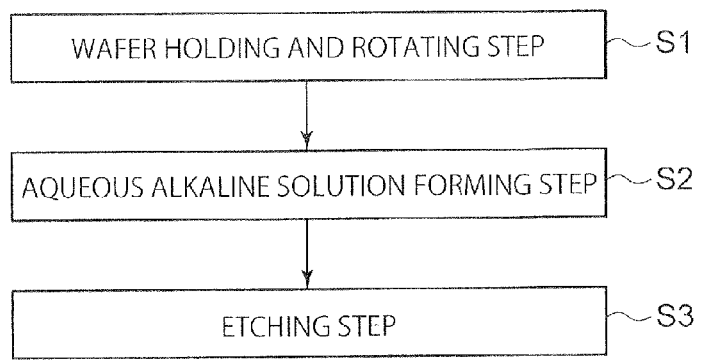
FIG. 2 is a flow chart illustrating a substrate processing method according to the first embodiment of the invention.

First, the wafer W is held horizontally on the placing bed 13 of the substrate holding mechanism 12 and the wafer W on the placing bed 13 is rotated by the rotational mechanism 14 (wafer holding and rotating step) (step S1 in FIG. 2).

Then, an aqueous alkaline solution L in which a predetermined amount of oxygen is dissolved is formed in the chemical solution supplying mechanism 30 (aqueous alkaline solution forming step (step S2 in FIG. 2). In this case, an amount of oxygen, which is equal to or more than the amount of oxygen in atmospheric air involved in the aqueous alkaline solution L flowing on the wafer W, is dissolved in the aqueous alkaline solution L. The aqueous alkaline solution forming step (step S2 in FIG. 2) is to be described more specifically.

First, pure water is supplied from the pure water supplying mechanism 31 of the liquid supplying mechanism 30 and pure water is sent by way of the supply pipe 34 to the oxygen dissolving mechanism 32. In the oxygen dissolving mechanism 32, pure water from the pure water supplying mechanism 31 is deaerated and a predetermined amount (predetermined concentration) of oxygen is dissolved therein. Then, pure water in which oxygen is dissolved is sent from the oxygen dissolving mechanism 32 by way of the pipeline 35 to the junction 38.

On the other hand, an alkaline chemical solution comprising an aqueous solution, for example, of potassium hydroxide (KOH), tetramethyl ammonium hydroxide (TMAH), sodium hydroxide (NaOH), aqueous ammonia ($NH_4OH$), choline, or hydrazine is delivered from the chemical solution supplying mechanism 33. The alkaline chemical solution passes through the supply pipe 36 and reaches the junction 38 where it is mixed with pure water from the oxygen dissolving mechanism 32. Thus, an aqueous alkaline solution L in which oxygen is dissolved is formed.

The concentration of oxygen in the aqueous alkaline solution L is adjusted so as to be equal with or more corresponding to the amount of oxygen in atmospheric air involved in the aqueous alkaline solution L flowing on the wafer W. Specifically, the concentration of oxygen is preferably 200 ppb to 1000 ppb and, more preferably, 200 ppb to 500 ppb.

In the aqueous alkaline solution L, a mixing ratio between the alkaline chemical solution from the chemical solution supplying mechanism 33 and pure water from the oxygen dissolving mechanism 32 (flow rate ratio) is preferably set as: alkaline chemical solution:pure water=1:1 to 1:100.

Subsequently, the formed aqueous alkaline solution L is passed through the supply pipe 37 and sent to the nozzle 17. Then, the aqueous alkaline solution L in which oxygen is dissolved is supplied from above the wafer W to the wafer W by the nozzle 17. The temperature when the aqueous alkaline solution L is supplied (temperature measured at the nozzle 17) can be at a temperature, for example, from a room temperature to 85° C. Further, the supplied amount of the aqueous alkaline solution L by the nozzle 17 (discharge amount) can be, for example, 0.5 L/min to 3.0 L/min.

The aqueous alkaline solution L discharged from the nozzle 17 flows from the central portion $W_a$ to the peripheral edge portion $W_b$ of the wafer W. Thus, etching is applied to the wafer W (etching step) (step S3 in FIG. 2).

The aqueous alkaline solution L flowing on the wafer W is shaken off by a centrifugal force due to rotation of the wafer W, further received by the liquid receiving unit 15 and discharged to the outside of the substrate processing apparatus 10. The step described above (steps S1 to S3) may be repeated for several times. Finally, the wafer W completed for etching is removed from the placing bed 13 of the substrate holding mechanism 12.

Incidentally, in the etching step, the aqueous alkaline solution L flows from the central portion $W_a$ to the peripheral edge portion $W_b$ of the wafer W and the thickness of the liquid membrane is reduced from the central portion $W_a$ to the peripheral edge portion $W_b$. Further, the aqueous alkaline solution L involves oxygen in the atmospheric air while the solution flows from the central portion $W_a$ to the peripheral edge portion $W_b$ of the wafer W.

Generally, oxygen involved in the liquid membrane on the surface of the wafer W gives an effect on the amount of etching (or etching rate) at the surface of the wafer W. That is, as the amount of oxygen dissolved in the liquid membrane increases, the etching amount tends to increase in that region. Further, when etching is carried out, the dissolution amount of oxygen is generally smaller in the central portion $W_a$ of the wafer W where the thickness of the liquid membrane is relatively large compared with the peripheral edge portion $W_b$ where the thickness of the liquid film is relatively small. Therefore, the etching amount tends to decrease in the central portion $W_a$ compared with that in the peripheral edge portion $W_b$ of the wafer W.

Specifically, near the central portion $W_a$ of the wafer W, since the film thickness of the aqueous alkaline solution L supplied to the wafer W is larger and the amount of oxygen in atmospheric air dissolved in the liquid film is smaller, the etching amount tends to decrease relatively. On the other hand, in a region outside of the central portion $W_a$ of the wafer W spaced, for example, by about 50 mm, since the liquid film of the aqueous alkaline solution L spreads by a centrifugal force, the film thickness is reduced and, as a result, the amount of oxygen in atmospheric air dissolved in the liquid film tends to increase. Accordingly, the etching amount is small in a region outside of the central portion $W_a$ of the wafer W spaced by about 50 mm and the etching amount tends to increase toward the peripheral edge portion $W_b$ of the wafer W.

Further, since the aqueous alkaline solution L is supplied from the central portion $W_a$ of the wafer W, a temperature gradient is formed radially on the wafer W and the liquid temperature of the aqueous alkaline solution L tends to lower toward the outer circumference of the wafer W. Accordingly, in a region spaced from the central portion $W_a$ of the wafer W by 100 mm or more, the etching amount tends to decrease toward the outer circumference of the wafer W.

On the contrary, in this embodiment, an amount of oxygen, which is equal to or more than the amount of oxygen in atmospheric air involved in the aqueous alkaline solution L flowing on the wafer W, is dissolved previously into the aqueous alkaline solution L (aqueous alkaline solution forming step). Accordingly, the concentration of oxygen in the liquid membrane of the aqueous alkaline solution L is substantially identical between the central portion $W_a$ and the peripheral edge portion $W_b$ of the wafer W. Therefore, the difference of the etching amount between the central portion $W_a$ and the peripheral edge portion $W_b$ of the wafer W can be decreased, so that the etching amount applied can be made uniform within the surface between the central portion $W_a$ and the peripheral edge portion $W_b$ of the wafer W.

As described above, according to this embodiment, since an amount of oxygen, which is equal to or more than the amount of oxygen in atmospheric air involved into the aqueous alkaline solution L flowing on the W, is dissolved previously, the etching amount applied can be made uniform in the radial direction from the central portion $W_a$ to the peripheral edge portion $W_b$ of the wafer W, so that the etching amount applied can be made uniform within the surface of the wafer W.

In this embodiment, when the aqueous alkaline solution L is supplied from the nozzle 17, the nozzle 17 is situated at a predetermined position above the center of rotation of the wafer W. However, the position is not restrictive but it may suffice that the aqueous alkaline solution L supplied from the nozzle 17 flows from the central portion $W_a$ to the peripheral edge portion $W_b$ of the wafer W. For example, when the aqueous alkaline solution L is supplied, the nozzle 17 may be reciprocated (scanned) slightly (for example, by about several mm to the right and left) in a horizontal direction near the central portion $W_a$ of the wafer W.

Example

Specific examples in this embodiment are to be described with reference to FIG. 3 and FIG. 4.

First, the wafer W is held horizontally on the placing bed 13 of the substrate holding mechanism 12 and rotated. In this example, the rotational speed of the wafer W was set to 1000 rpm.

Successively, an aqueous alkaline solution L in which oxygen is dissolved was prepared by using a liquid supplying mechanism 30. First, pure water was supplied from the pure water supplying mechanism 31 to the oxygen dissolving mechanism 32 and oxygen is dissolved into pure water from the pure water supplying mechanism 31 in the oxygen dissolving mechanism 32. Subsequently, pure water in which oxygen was dissolved as described above was mixed with an alkaline chemical solution (aqueous solution of potassium hydroxide (KOH)) from the chemical solution supplying mechanism 33. The mixing ratio of the alkaline chemical solution and pure water (flow rate ratio) was set as: alkaline chemical solution:pure water=1:5.

Substantially, the aqueous alkaline solution L was supplied from the nozzle 17 to the wafer W at a temperature of 70° C. In this case, the amount of the aqueous alkaline solution L supplied from the nozzle 17 was set to 1.5 L/min.

As described above, the wafer W was etched by supplying the aqueous alkali solution L from the nozzle 17 to the wafer W. Subsequently, the etching amount at the surface of the wafer W was measured in a radial direction.

The steps were performed respectively on seven types of aqueous alkaline solutions L in which the concentration of oxygen in the aqueous alkaline solution L was changed. The results are illustrated in FIG. 3 and FIG. 4. FIG. 3 is a graph for the result of measuring the etching amount at the surfaces of respective wafers W with respect to the seven types of aqueous alkaline solutions L in which the concentration of oxygen in the aqueous alkaline solution L was changed. FIG. 4 is a graph illustrating a relation between the concentration of oxygen in the aqueous alkaline solution L and the etching amount on the surface of the wafer W.

Figure 3:
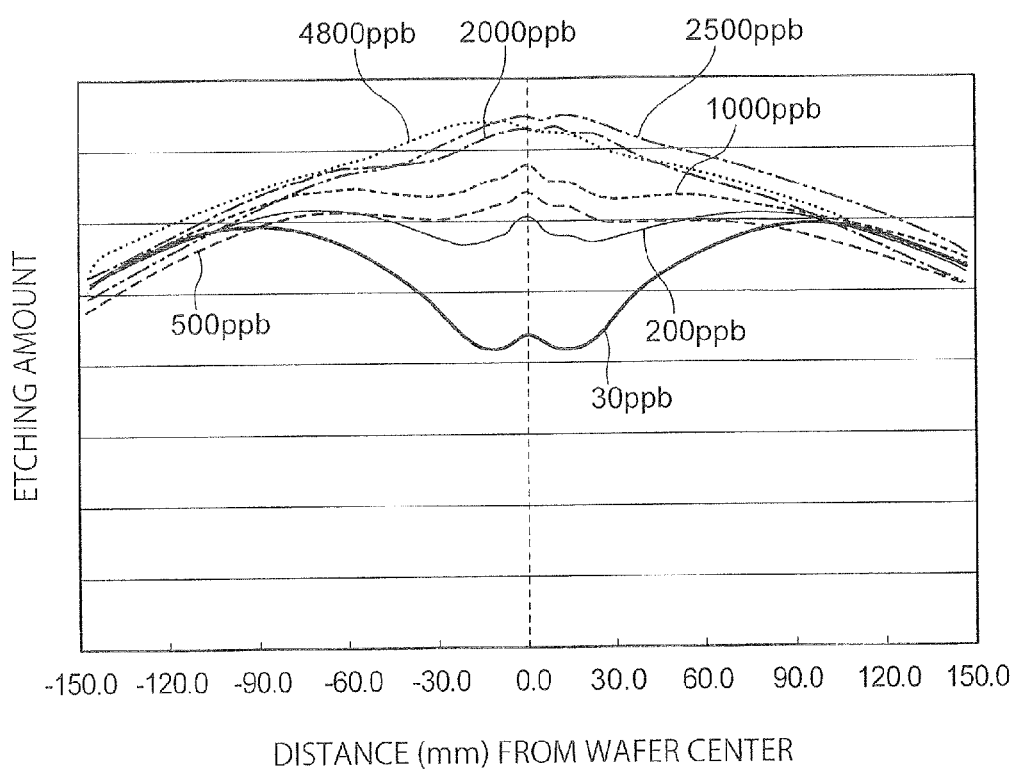
FIG. 3 is a graph illustrating the result of measurement of an etching amount at the surface of a wafer when a concentration of oxygen in an aqueous alkaline solution is changed in examples of the first embodiment of the invention.

In FIG. 3, the abscissa represents a distance (mm) from the central portion $W_a$ of the wafer W and the ordinate represents an etching amount.

As illustrated in FIG. 3, in a wafer W etched by using an aqueous alkaline solution L at a concentration of oxygen of 30 ppb, the etching amount decreased in a region spaced by about ±90 mm from the central portion $W_a$ of the wafer W compared with other regions.

In wafers W etched by using aqueous alkaline solutions L at concentrations of oxygen of 200 to 1000 ppb, the etching amount applied was substantially uniform in the entire region of the wafer W (region of ±150 mm from the center). In particular, in wafers using aqueous alkaline solutions L at the concentration of oxygen of 200 to 500 ppb, the etching amount applied was able to be made more uniform.

On the other hand, in wafers W etched by using aqueous alkaline solutions L at the concentration of oxygen of 2000 to 4800 ppb, the etching amount tended to increase toward the central portion $W_a$ of a wafer W.

In view of the above, it was found that the etching amount applied was able to be made uniform in the radial direction from the central portion $W_a$ to the peripheral edge portion $W_b$ of the wafer W when the concentration of oxygen in the aqueous alkaline solution was set to 200 ppb to 1000 ppb, particularly, 200 to 500 ppb.

In a region spaced by 100 mm or more from the central portion $W_a$ of the wafer W, the etching amount tends to decrease toward the outer circumference of the wafer W irrespective of the concentration of oxygen in the aqueous alkaline solution L. This is considered to be attributable to that a temperature gradient is formed in the radial direction on the wafer W and the liquid temperature of the aqueous alkaline solution L lowers toward the outer circumference of the wafer W.

Figure 4:
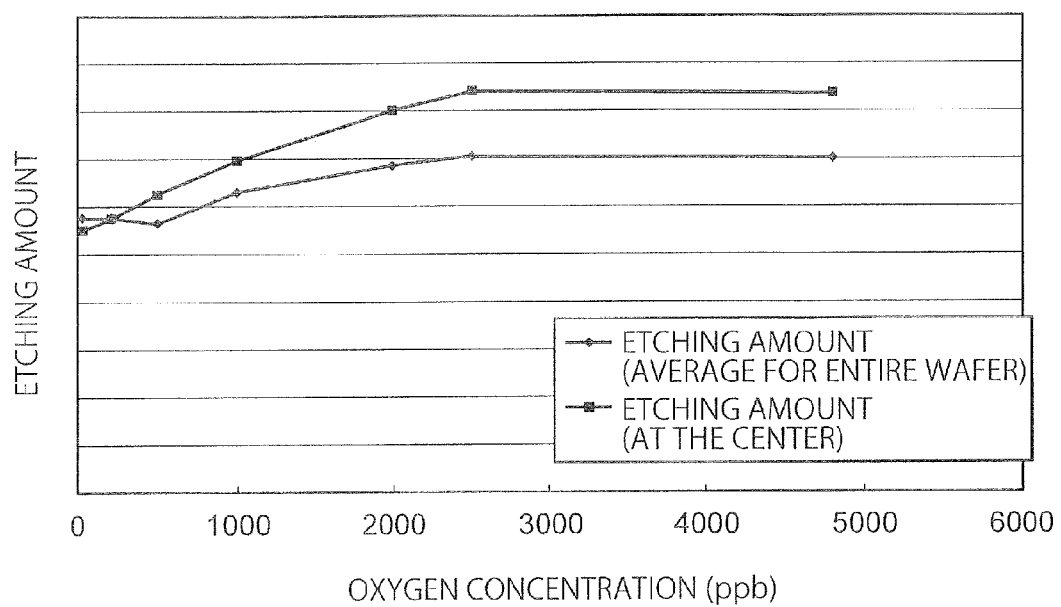
FIG. 4 is a graph illustrating a relation between the concentration of oxygen in an aqueous alkaline solution and an etching amount at the surface of a wafer in examples according to the first embodiment of the invention.
Figure 5:
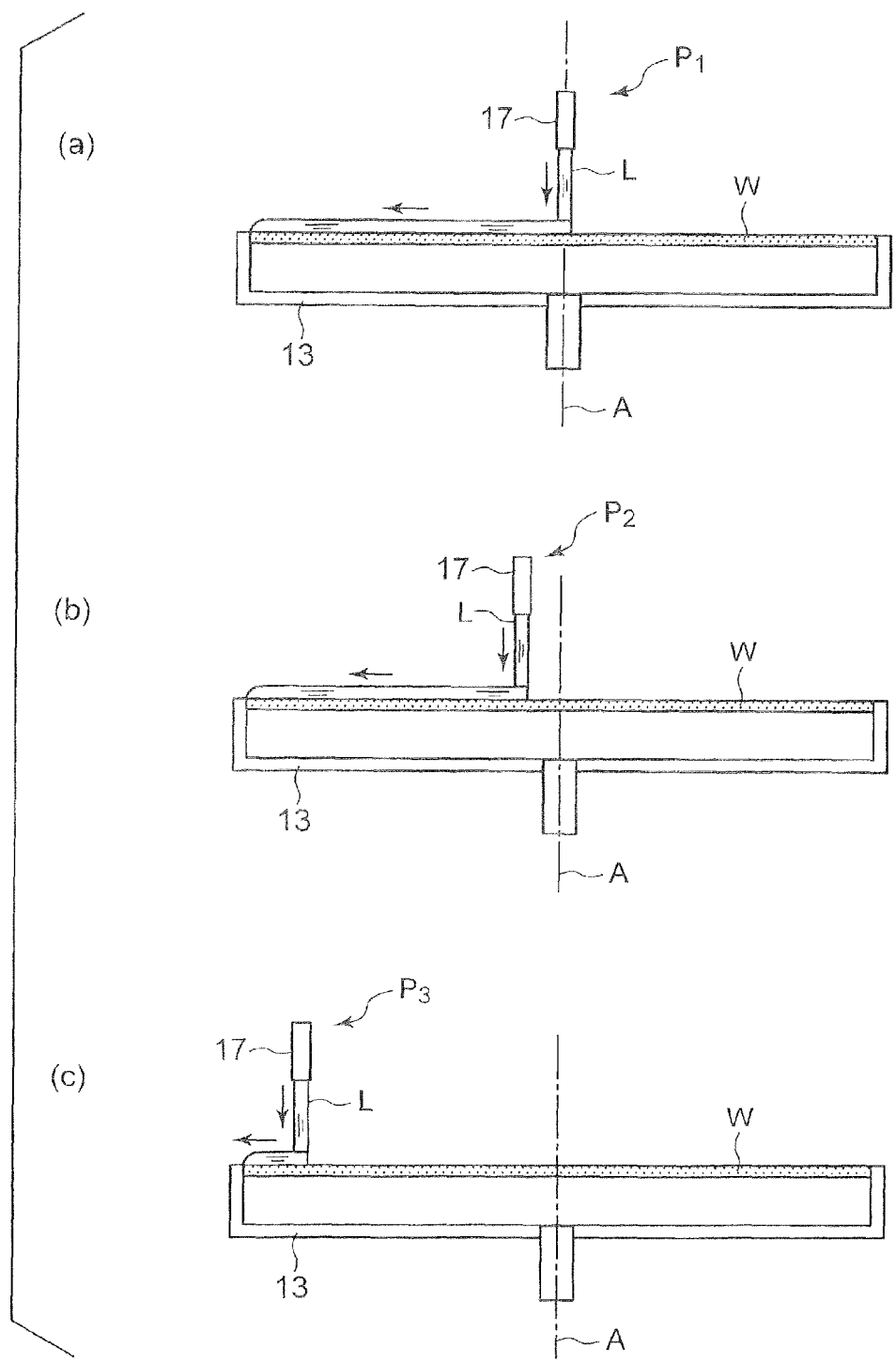
FIG. 5($a$) to FIG. 5($c$) are schematic views illustrating moving positions of a nozzle in a second embodiment according to the invention.
Figure 6:
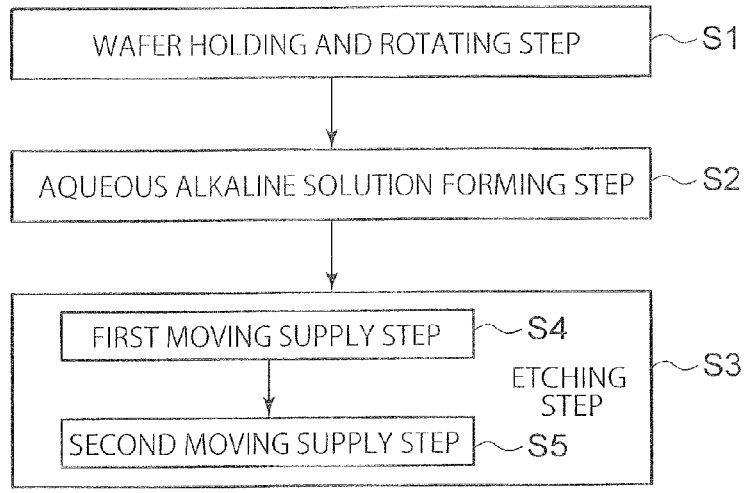
FIG. 6 is a flow chart illustrating a substrate processing method according to the second embodiment of the invention.

In FIG. 4, the abscissa represents a concentration of oxygen in an aqueous alkaline solution L (ppb), and the ordinate represents an etching amount.

As illustrated in FIG. 4, the etching amount tends to increase as the concentration of oxygen in the aqueous alkaline solution L increases. However, the etching amount was scarcely changed even when the concentration of oxygen was increased to 2,500 ppb or more (both for the average of the entire wafer W and for the central portion $W_a$ of the wafer W). It is considered that this is attributable to that the oxygen concentration reaching saturation of the etching rate (hereinafter referred to as a saturation concentration of oxygen) is about 2,500 ppb.

Second Embodiment

Then, a second embodiment of a substrate processing method, a substrate processing apparatus, and a storage medium according to the invention is to be described with reference to FIG. 1 and FIG. 5 to FIG. 11. In FIG. 5 to FIG. 11, identical portions with those in the embodiment described above carry the same reference numerals for which detailed descriptions are to be omitted.

Configuration of Substrate Processing Apparatus

The configuration of the substrate processing apparatus according to this embodiment is substantially identical with that of the substrate processing apparatus 10 illustrated in FIG. 1 described above. That is, a substrate processing apparatus 10 according to this embodiment includes: a substrate holding mechanism 12 for holding a wafer W horizontally and rotating the wafer W; a nozzle 17 disposed above the substrate holding mechanism 12, the nozzle 17 supplying an aqueous alkaline solution L to the wafer W, thereby etching the wafer W; and a liquid supplying mechanism 30 connected to the nozzle 17, the liquid supplying mechanism 30 supplying to the nozzle 17 an aqueous alkaline solution (aqueous solution of potassium hydroxide (KOH)) L in which oxygen is dissolved. In the followings, description is made mainly for the difference from the substrate processing apparatus 10 illustrated in FIG. 1.

In this embodiment, as illustrated in FIG. 5(a) to FIG. 5(c), the nozzle 17 is movable in the horizontal direction above the wafer W. In this case, the nozzle 17 is controlled by the controller 50 and can move horizontally to optional positions above the wafer W. Further, the nozzle can stop at any optional position. In particular, in this embodiment, the nozzle 17 is adapted to move among a first position $P_1$ (FIG. 5(a)) a second position $P_2$ outside of the first position $P_1$ (FIG. 5(b)), and a third position $P_3$ outside of the second position $P_2$ (FIG. 5(c)) above the central portion $W_a$ (above the vertical rotational axis A) of the wafer W. Among them, the second position $P_2$ (FIG. 5(b)) is situated to the outside of the vertical rotational axis A spaced, for example, by about 5 mm to 100 mm and the third position $P_3$ (FIG. 5(c)) is situated to the outside from the vertical rotational axis A spaced, for example, by about 80 mm to 150 mm.

In this embodiment, the controller 50 controls the liquid supplying mechanism 30 (pure water supplying mechanism 31, the oxygen dissolving mechanism 32, and the chemical solution supplying mechanism 33) such that the aqueous alkaline solution L supplied from the nozzle 17 dissolves oxygen so as to be at or more than the saturation concentration of oxygen. Specifically, the controller 50 preferably controls the liquid supplying mechanism 30 such that the concentration of oxygen in the aqueous alkaline solution L is 2,500 ppb or more and, more preferably, 3,000 ppb or more. By increasing the concentration of oxygen in the aqueous alkaline solution L at or more than the saturation concentration of oxygen, the etching amount applied can be made more uniform within the surface in the substrate processing method to be described later.

Substrate Processing Method Using Substrate Processing Apparatus

Then, the function of this embodiment comprising such a configuration, specifically, a substrate processing method of using the substrate processing apparatus described above is to be described with reference FIG. 5 and FIG. 6. The following operations are carried out by the controller 50.

First, the wafer W is held horizontally on the placing bed 13 of the substrate holding mechanism 12 and the wafer W on the placing bed 13 is rotated by the rotational mechanism 14 (wafer holding and rotating step) (step S1).

Then, an aqueous alkaline solution L in which a predetermined amount of oxygen is dissolved is formed by the liquid supplying mechanism 30 (aqueous alkaline solution forming step) (step S2). In this case, oxygen at or more than the saturation concentration of oxygen is dissolved in the aqueous alkaline solution L. Specifically, the concentration of oxygen is preferably 500 ppb or more and, more preferably, 3000 ppb or more as described above. Details for the aqueous alkaline solution preparation step (Step S2) are substantially identical with those of the aqueous alkaline solution forming step in the first embodiment described above (step S2 in FIG. 2).

Subsequently, the formed aqueous alkaline solution L is passed through the supply pipe 37 and sent to the nozzle 17. Then, the aqueous alkaline solution L in which oxygen is dissolved is supplied from above the wafer W to the wafer W by the nozzle 17. The temperature when the aqueous alkaline solution L is supplied (temperature measured at nozzle 17) can be at a temperature, for example, from a room temperature to 85° C. Further, the amount of supplying the aqueous alkaline solution L by the nozzle 17 (discharge amount) can be, for example, 0.5 L/min to 3.0 L/min.

The aqueous alkaline solution L supplied from the nozzle 17 flows to the radial outside of the wafer W by a centrifugal force and etching is applied to the wafer W (etching step) (step S3). Details for the etching step (step S3) are to be described further.

That is, the nozzle 17 is moved to the second position $P_2$ (FIG. 5(b)) and the aqueous alkaline solution L from the nozzle 17 is started to discharge. Successively, the aqueous alkaline solution L is supplied to the wafer W while moving the nozzle 17 from the second position $P_2$ to the first position $P_1$ (FIG. 5(a)) at a speed $V_1$ (first moving supply step) (step S4).

In the first moving supply step (step S4), the nozzle 17 may be moved to the first position $P_1$, the second position $P_2$, and the first position $P_1$ in this order. That is, the nozzle 17 is first moved to the first position $P_1$ (FIG. 5(a)) and, at the same time, the aqueous alkaline solution L is started to discharge, and then the nozzle 17 is moved from the first position $P_1$ to the second position $P_2$ while supplying the aqueous alkaline solution L to the wafer W (FIG. 5(b)). Subsequently, the aqueous alkaline solution L may be supplied to the wafer W while moving the nozzle 17 from the second position $P_2$ to the first position $P_1$ (FIG. 5(a)).

Subsequently, the nozzle 17 is moved from the first position $P_1$ to the third position $P_3$ at a speed $V_2$ ($V_2 > V_1$). Then, the aqueous alkaline solution L is supplied to the wafer W while moving the nozzle 17 from the third position $P_3$ to the second position $P_2$ at a speed $V_3$ ($V_3 > V_2$) (second moving supply step) (step S5). After reaching from the first position $P_1$ to the third position $P_3$, the nozzle 17 may be started to move to the second position $P_2$ directly, but the nozzle 17 may be stopped for a predetermined period in a state of discharging the aqueous alkaline solution L after reaching the third position $P_3$ and then started to move to the second position $P_2$.

After the nozzle 17 has reached the second position $P_2$, supply of the aqueous alkaline solution L from the nozzle 17 is stopped. Thus, etching of the wafer W by the aqueous alkaline solution L is completed.

The aqueous alkaline solution L flowing on the wafer W is shaken off by a centrifugal force due to rotation of the wafer W, further received in the liquid receiving unit 15 and discharged to the outside of the substrate processing apparatus 10. Successively, the wafer W for which etching has been completed is removed from the placing bed 13 of the substrate holding mechanism 12.

Incidentally, in the etching step, the aqueous alkaline solution L flows to the radial outside of the wafer W and the thickness of the liquid film is reduced toward the radial outside of the wafer W. Further, the aqueous alkaline solution L involves oxygen in atmospheric air while flowing to the radial outside of the wafer W.

In general, near the central portion $W_a$ of the wafer W (region spaced, for example, by about 20 mm from the central portion $W_a$), since the film thickness of the aqueous alkaline solution supplied to the wafer W is large and the amount of oxygen dissolved in atmospheric air is small, the etching amount tends to decrease relatively. On the other hand, in a region spaced, for example, by about 50 mm from the central portion $W_a$ of the wafer W (for example, near the second position $P_2$), since the liquid film of the aqueous alkaline solution L is spread by a centrifugal force, the thickness of the liquid film is decreased and, as a result, the amount of oxygen in the atmospheric air dissolved into the aqueous alkaline solution increases. Accordingly, the etching amount tends to increase from the region outside of the central portion $W_a$ spaced by about 50 mm to the peripheral edge portion $W_b$ of the wafer W.

On the other hand, when the aqueous alkaline solution L is supplied from the central portion $W_a$ of the wafer W, a temperature gradient is formed radially on the wafer W and the liquid temperature of the aqueous alkaline solution L tends to lower toward the outer circumference of the wafer W. Accordingly, in a region spaced from the central portion $W_a$ of the wafer W by 100 mm or more (for example outside of the third position $P_3$), the etching amount tends to decrease toward the outer circumference of the wafer W.

On the contrary, in this embodiment, oxygen is previously dissolved in the aqueous alkaline solution L and the aqueous alkaline solution L is supplied to the wafer W while moving the nozzle 17 from the second position $P_2$ to the first position $P_1$ during etching (first moving supply step) and, subsequently, the aqueous alkaline solution L is supplied to the wafer W while moving the nozzle 17 from the third position $P_3$ to the second position $P_2$ (second moving supply step). Thus, the aqueous alkaline solution L in which oxygen is dissolved is supplied mainly to a place of the wafer W where the etching amount tends to decrease relatively (for example, near the second position $P_2$ and outside of the third position $P_3$), whereby the etching amount in the place can be increased. This can make the etching amount applied uniform in the radial direction from the central portion $W_a$ to the peripheral portion $W_b$ of the wafer W and the etching amount applied can be made uniform within the surface of the wafer W.

As described above according to this embodiment, since the effect on the etching due to involution of oxygen in atmospheric air into the aqueous alkaline solution flowing on the wafer W and generation of the temperature gradient in the aqueous alkaline solution on the wafer W are compensated, the etching amount applied can be made uniform within the surface from the central portion $W_a$ to the peripheral edge portion $W_b$ of the wafer W.

Modified Example

Figure 7:
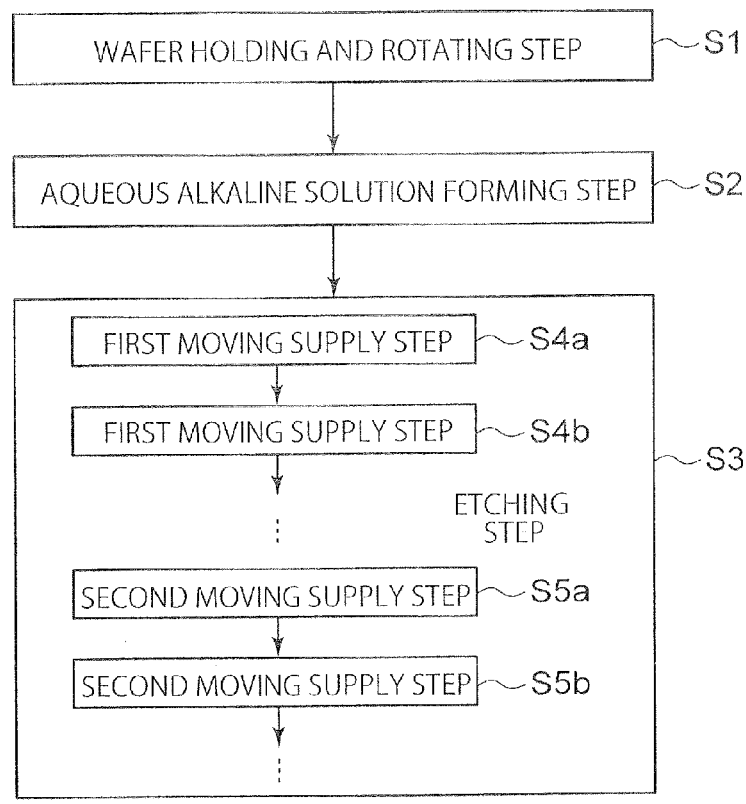
FIG. 7 is a flow chart illustrating a substrate processing method according to a modified example of the second embodiment of the invention.

Then, a modified example of this embodiment is to be described with reference to FIGS. 5(a) to 5(c) and FIG. 7. FIG. 7 is a flow chart illustrating a modified example of a substrate processing method according to this embodiment. The modified example illustrated in FIG. 7 is different from the embodiment described above (FIG. 6) for the method of controlling the nozzle 17 in the etching step (step S3) and other configurations are identical with those of the embodiment described above (FIG. 6). Also in this modified example, the substrate processing apparatus 10 illustrated in FIG. 1 is used as the substrate processing apparatus.

As illustrated in FIG. 7, after performing the first moving supply step (step S4a, S4b, ...) by a plurality of times in an etching step (step S3), a second moving supply step (steps S5a, S5b, ...) is performed.

First, the nozzle 17 is moved to the second position $P_2$ (FIG. 5(b)) and the aqueous alkaline solution L from the nozzle 17 is started to discharge. Successively, while moving the nozzle 17 from the second position $P_2$ to the first position $P_1$ (FIG. 5(a)), an aqueous alkaline solution L is supplied to the wafer W (first moving supply step) (step S4a).

After reaching the first position $P_1$, the nozzle 17 moves from the first position $P_1$ to the second position $P_2$. Successively, the nozzle 17 supplies the aqueous alkaline solution L to the wafer W while moving again from the second position $P_2$ to the first position $P_1$ (first moving supply step) (step S4b).

In this manner, nozzle 17 supplies the aqueous alkaline solution L to the wafer W while reciprocating between the second position $P_2$ and the first position $P_1$ by several times.

After reciprocation between the second position $P_2$ and the first position $P_1$ by predetermined times, the nozzle 17 moves to the third position $P_3$ (FIG. 5(c)). The nozzle 17 may be stopped for a predetermined period when it reaches the third position $P_3$. Then, the nozzle 17 supplies the aqueous alkaline solution L to the wafer W while moving from the third position $P_3$ to the second position $P_2$ (second moving supply step) (step S5a).

After reaching the second position $P_2$, the nozzle 17 moves from the second position $P_2$ to the third position $P_3$. Successively, the nozzle 17 supplies the aqueous alkaline solution L to the wafer W while moving again from the third position $P_3$ to the second position $P_2$ (second moving supply step) (step S5b).

In this manner, the nozzle 17 supplies the aqueous alkaline solution L to the wafer W while reciprocating between the third position $P_3$ and the second position $P_2$ by a plurality of times.

After reciprocation between the third position $P_3$ and the second position $P_2$ by predetermined times, supply of the aqueous alkaline solution L from the nozzle 17 is stopped. Thus, etching for the wafer W by the aqueous alkaline solution L is completed.

As described above, according to this modified example, the aqueous alkaline solution L is supplied to the wafer W while reciprocating the nozzle 17 between the second position $P_2$ and the first position $P_1$ (first moving supply steps are performed by plural times). Then, the aqueous alkaline solution L is supplied to the wafer W while reciprocating the nozzle 17 between the third position $P_3$ and the second position $P_2$ (second moving supply step is performed by a plurality of times). Thus, the aqueous alkaline solution L in which oxygen is dissolved is supplied mainly to a place of the wafer W where the etching amount tends to decrease relatively (for example, near the second position $P_2$ and at the outside of the third position $P_3$) and the etching amount at the place can be increased. Thus, the etching amount applied can be made further uniform from the central portion $W_a$ to the peripheral edge portion $W_b$ of the wafer W.

Figure 8:
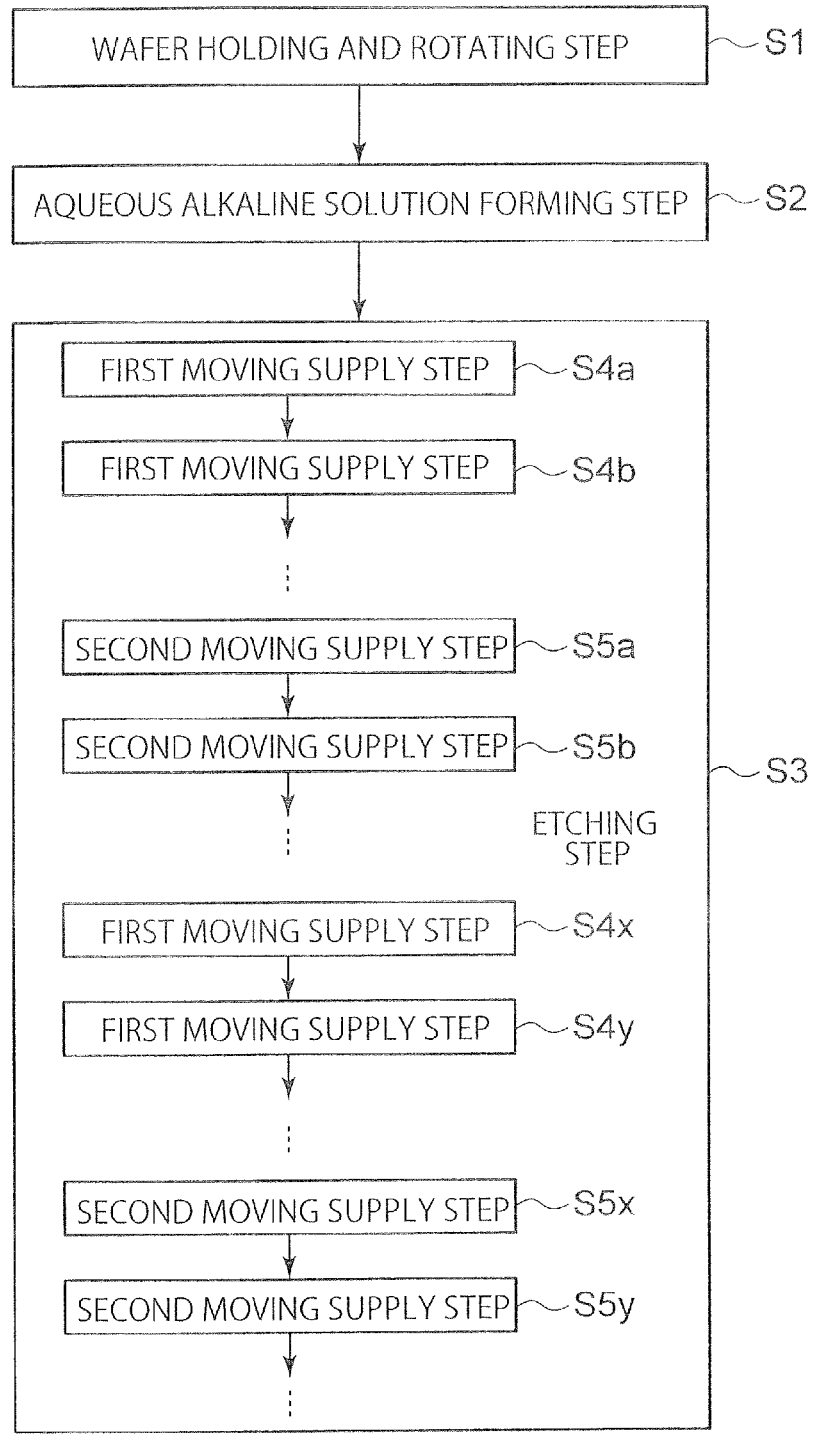
FIG. 8 is a flow chart illustrating a substrate processing method according to another modified example of the second embodiment of the invention.

Then, another modified example of this embodiment is to be described with reference to FIG. 5(a) to FIG. 5(c) and FIG. 8. FIG. 8 is a flow chart illustrating another modified example of the substrate processing method according to this embodiment. The modified example illustrated in FIG. 8 is different in the control method for controlling the nozzle 17 in the etching step (step S3) and other configurations are substantially identical with those of the embodiment (FIG. 6) and the modified example (FIG. 7) described above.

As illustrated in FIG. 8, a combination of a first moving supply step (step S4a, S4b, ...) and a second moving supply step (step S5a, S5b, ...) is performed by a plurality of times in the etching step (step S3).

First, the nozzle 17 is reciprocated between the second position $P_2$ (FIG. 5(b)), and the first position $P_1$ (FIG. 5(a)), thereby performing the first moving supply step by a plurality of times (step S4a, S4b, ...).

Then, the second moving supply step is performed by a plurality of times by reciprocating the nozzle 17 between the third position $P_3$ (FIG. 5(c)) and the second position $P_2$ (steps S5a, S5b, ...).

In this manner, the combination of the first moving supply step (step S4a, S4b, ...) and the second moving supply step (steps S5a, S5b ...) (first time) is completed.

Successively, the first moving supply step is performed by a plurality of times by reciprocating the nozzle 17 again between the second position $P_2$ and the first position $P_1$.

Subsequently, the second moving supply step is performed by a plurality of times by reciprocating the nozzle 17 again between the third position $P_3$ and the second position $P_2$.

In this manner, the combination (second time) of the first moving supply step and the second moving supply step is completed.

Subsequently, the combination of the first moving supply step (step S4x, S4y, ...) and the second moving supply step (step S5x, S5y, ...) is repeated by a predetermined number of times, and etching for the wafer W by the aqueous alkaline solution L is completed.

As described above, according to this modified example, oxygen is previously dissolved in the aqueous alkaline solution L and the combination of the first moving supply step and the second moving supply step is performed by a plurality of times in the etching. Thus, the etching amount applied can be made uniform within the surface from the central portion $W_a$ to the peripheral edge portion $W_b$ of the wafer W.

Example

Specific examples of this embodiment are to be described with reference to FIG. 9 to FIG. 11 but the invention is not restricted to the following description of the example so long as it does not exceed the gist of the invention.

Example

First, the wafer W is held horizontally on the placing bed 13 of the substrate holding mechanism 12 and rotated. In this case, the rotational speed of the wafer W was set to 1000 rpm.

Successively, an aqueous alkaline solution L in which oxygen was dissolved was prepared by using the liquid supplying mechanism 30. First, pure water was supplied from the pure water supplying mechanism 31 to the oxygen dissolving mechanism 32, and oxygen was dissolved into pure water from the pure water supplying mechanism 31 in the oxygen dissolving mechanism 32. Subsequently, pure water in which oxygen was dissolved was mixed with an alkaline chemical solution (aqueous solution of potassium hydroxide (KOH)) from the chemical solution supplying mechanism 33. The mixing ratio of the alkaline chemical solution and pure water (flow rate ratio) was set as: alkaline chemical solution:pure water=1:5. Further, the concentration of oxygen in the aqueous alkaline solution L was set to 3000 ppb.

Subsequently, the aqueous alkaline solution L was supplied from the nozzle 17 to the wafer W at a temperature of 70° C. In this case, the amount of the aqueous alkaline solution L supplied from the nozzle 17 was set to 1.5 L/min.

In the course of the process, the aqueous alkaline solution L was supplied to the wafer W while moving the nozzle 17 first from the second position $P_2$ to the first position $P_1$ (position above the vertical rotational axis A) (first moving supply step). Subsequently, the nozzle 17 was moved to the third position $P_3$. Then, the aqueous alkaline solution L was supplied to the wafer W while moving the nozzle 17 from the third position $P_3$ to the second position $P_2$ (second moving supply step).

In this manner, the wafer W was etched by supplying the aqueous alkaline solution L from the nozzle 17 to the wafer W. Subsequently, the etching amount at the surface of the wafer W was measured in a radial direction.

Figure 9:
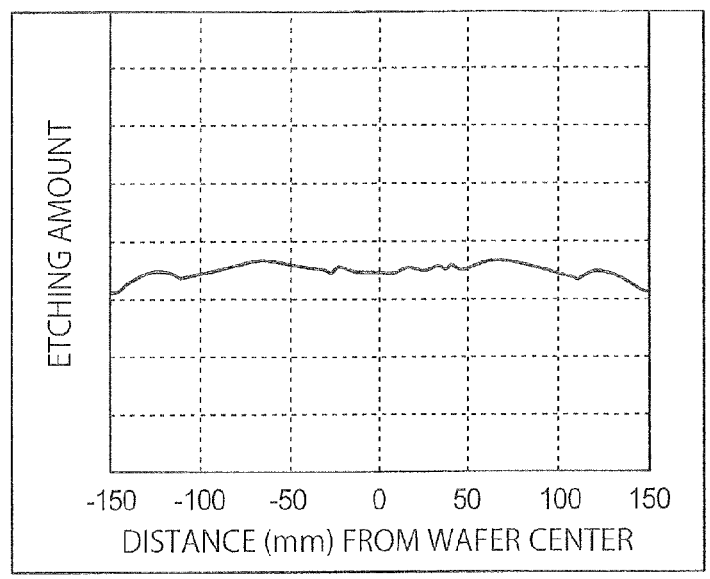
FIG. 9 is a graph showing the result of measurement for an etching amount at the wafer surface when using the substrate processing method according to the examples of the second embodiment of the invention.

The result is shown in FIG. 9. In FIG. 9, the abscissa represents a distance (mm) from the central portion $W_a$ of the wafer W and the ordinate represents an etching amount. As a result, the etching amount applied can be made substantially uniform over the entire region of the wafer W (region ±150 mm from the center).

Comparative Example 1

Etching was applied to the wafer W in the same manner as in the examples described above except for not previously dissolving oxygen in the aqueous alkaline solution supplied from the nozzle 17. Subsequently, the etching amount at the surface of the wafer W was measured in a radial direction.

Figure 10:
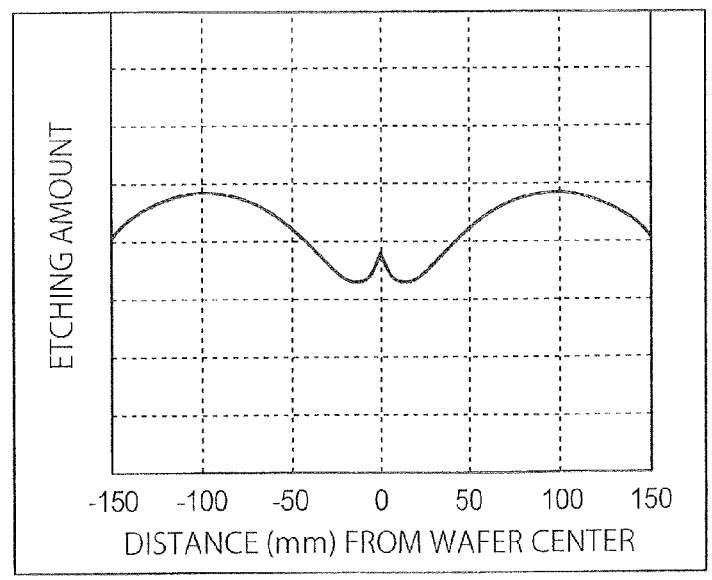
FIG. 10 is a graph illustrating a result of measurement for the etching amount on the wafer surface when using the substrate processing method according to a comparative example.

As a result, as shown in FIG. 10, the etching amount decreases in the vicinity of the central portion $W_a$ of the wafer W (for example, in a region spaced by about 20 mm from the central portion $W_a$) and the etching amount increases therefrom to the peripheral edge portion $W_b$ of the wafer W (for example, to a region spaced by about 100 mm from the center $W_b$). Further, in a region spaced by 100 mm or more from the central portion $W_a$ of the wafer W, etching amount tended to decrease toward the outer circumference of the wafer W. That is, it is considered to be difficult to make the etching amount of the wafer W applied uniform, if oxygen was not dissolved in the aqueous alkaline solution, even when the aqueous alkaline solution is supplied mainly to a place where the etching amount tends to decrease.

Comparative Example 2

Etching was applied to the wafer W in the same manner as in the example described above except for supplying the aqueous alkaline solution L in which oxygen is dissolved previously therein (concentration of oxygen: 3000 ppb) in a state of fixing the nozzle 17 at the first position $P_1$ (position above the vertical rotational axis A). Subsequently, the etching amount at the surface of the wafer W was measured in a radial direction.

Figure 11:
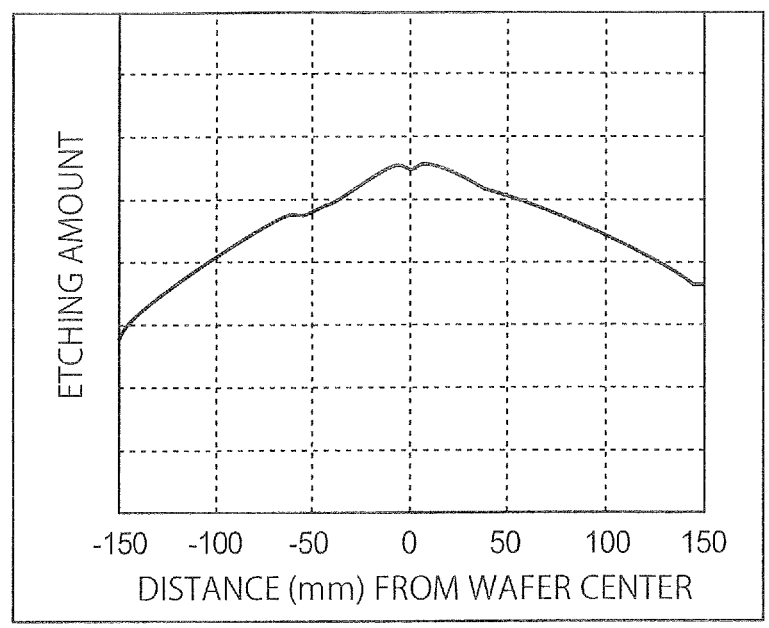
FIG. 11 is a graph illustrating a result of measurement for the etching amount on the wafer surface when using the substrate processing method according to a comparative example.

As a result, as illustrated in FIG. 11, the etching amount was greatest at the central portion $W_a$ of the wafer W and the etching amount tended to decrease from the central portion $W_a$ to the peripheral edge portion $W_b$.

Third Embodiment

Then, a third embodiment of a substrate processing method, a substrate processing apparatus and a storage medium according to the invention is to be described with reference to FIG. 1 and FIG. 12 to FIG. 16. In FIG. 12 to FIG. 16, identical portions with those of the embodiment described above carry the same reference numerals for which detailed descriptions are to be omitted.

Configuration of Substrate Processing Apparatus

The configuration of the substrate processing apparatus according to this embodiment is substantially identical with the configuration of the substrate processing apparatus 10 illustrated in FIG. 1 described above. That is, a substrate processing apparatus 10 according to this embodiment includes: a substrate holding mechanism 12 for holding a wafer W horizontally and rotating the wafer W; a nozzle 17 disposed above the substrate holding mechanism 12, the nozzle 17 supplying an aqueous alkaline solution L to the wafer W thereby etching the wafer W; and a liquid supplying mechanism 30 connected to the nozzle 17 and supplying an aqueous alkaline solution (aqueous solution of potassium hydroxide (KOH)) L in which oxygen is dissolved to the nozzle 17. In the followings, description is made mainly for the difference from the substrate processing apparatus 10 illustrated in FIG. 1.

In this embodiment, the controller 50 controls the nozzle 17 and the liquid supplying mechanism 30 so as to supply the aqueous alkaline solution L at a first oxygen concentration for a predetermined period (for example, X seconds) to the wafer W and, subsequently, supply an aqueous alkaline solution L at a second oxygen concentration different from the first oxygen concentration for a predetermined period (for example, Y seconds). In this case, the first concentration may be set to 100 ppb or less (concentration where oxygen is not substantially dissolved) and the second concentration may be set to a predetermined value larger than the first concentration.

In this case, the controller 50 may change various conditions with respect to the supply of the aqueous alkaline solution L between a case in which an aqueous alkaline solution L at the first oxygen concentration is supplied and a case in which the aqueous alkaline solution L at the second oxygen concentration is supplied. In this case, the etching amount of the wafer W applied can be made uniform within the surface. Here, various conditions with respect to the supply of the aqueous alkaline solution L includes one or a plurality of a period of supplying the aqueous alkaline solution L, a flow rate of the aqueous alkaline solution L, a temperature upon supply of the aqueous alkaline solution L, and a number of rotation of the wafer W.

Substrate Processing Method Using Substrate Processing Apparatus

Then, the function of this embodiment comprising such a configuration, specifically, a substrate processing method of using the substrate processing apparatus described above is to be described with reference to FIG. 12. The following operations are carried out by the controller 50.

First, the wafer W is held horizontally on the placing bed 13 of the substrate holding mechanism 12 and the wafer W on the placing bed 13 is rotated by the rotational mechanism 14 (wafer holding and rotating step) (step S1).

Subsequently, an aqueous alkaline solution L at a first oxygen concentration is formed by the liquid supplying mechanism 30 (first aqueous alkaline solution forming step) (step S2a). Details for the first aqueous alkaline solution forming step (step S2a) are substantially identical with those of the aqueous alkaline solution forming step in the first embodiment described above (step S2a in FIG. 2). When the first oxygen concentration is 100 ppb or less, an aqueous alkaline solution L in which oxygen is not dissolved may be formed in the first aqueous alkaline solution forming step (S2a).

Subsequently, the aqueous alkaline solution L at the first oxygen concentration is supplied through the supply pipe 37 to the nozzle 17. Then, the aqueous alkaline solution L at the first oxygen concentration is supplied from above the wafer W to the wafer W (for example, for X seconds) (first supply step) (step S6a). The temperature when the aqueous alkaline solution L is supplied (temperature measured at the nozzle 17) can be set to a temperature, for example, from a room temperature to 85° C. Further, the amount of the aqueous alkaline solution L supplied by the nozzle 17 (discharge amount) can be, for example, as 0.5 L/min to 3.0 L/min.

The aqueous alkaline solution L at the first oxygen concentration supplied from the nozzle 17 flows by a centrifugal force to a radial outside of the wafer W and etching is applied to the wafer W (etching step).

Subsequently, an aqueous alkaline solution L at a second oxygen concentration is formed by the liquid supplying mechanism 30 (second aqueous alkaline solution forming step) (step S2b).

Successively, the aqueous alkaline solution L at the second oxygen concentration is supplied through the supply pipe 37 to the nozzle 17. Subsequently, an aqueous alkaline solution L at the second oxygen concentration is supplied from above the wafer W to the wafer W for a predetermined period (for example, Y seconds) (second supply step S6b). Preferably, the second supply step is carried out continuously succeeding to the first supply step without interposing a DIW rinsing step, etc. therebetween. The temperature when the aqueous alkaline solution L is supplied (temperature measured at the nozzle 17) can be at a temperature, for example, from a room temperature to 85° C. Further, the amount of the aqueous alkaline solution L supplied by the nozzle 17 can be, for example, 0.5 L/min to 3.0 L/min.

The aqueous alkaline solution L at the second oxygen concentration supplied from the nozzle 17 flows by a centrifugal force to the radial outside of the wafer W and etching is applied to the wafer W (etching step).

One or plurality of a period for supplying the aqueous alkaline solution L, a flow rate of the aqueous alkaline solution L, a temperature upon supply of the aqueous alkaline solution L, and a number of rotation of the wafer W, may be different between the first supply step (step S6a) and the second supply step (step S6b). This can make the etching amount applied further uniform within the surface of the wafer W.

Subsequently, supply of the aqueous alkali solution L from the nozzle 17 is stopped. As described above, etching of the wafer W by the aqueous alkaline solution L is completed.

The aqueous alkaline solution flowing on the wafer W is shaken off by a centrifugal force due to rotation of the wafer W, further received in the liquid receiving unit 15, and discharge to the outside of the substrate processing apparatus 10. Successively, the wafer W completed for etching is removed from the placing bed 13 of the substrate holding mechanism 12.

As described above, according to this embodiment, after supplying the aqueous alkaline solution L at the first oxygen concentration for a predetermined period to the wafer W (first supply step), the aqueous alkaline solution L at the second oxygen concentration is supplied for a predetermined period (second supply step). Thus, the etching amount at the circumferential edge portion $W_b$ of the wafer W is increased by supplying, for example, the aqueous alkaline solution L in which oxygen is not dissolved (first oxygen concentration: 100 ppb or less) to the wafer W in the first supply step. Subsequently, the aqueous alkaline solution L in which oxygen is dissolved (second oxygen concentration>first oxygen concentration) is supplied to the wafer W in the second supply step, thereby increasing the etching amount in the central portion $W_a$ of the wafer W. Thus, the etching amount applied can be made uniform within the surface from the central portion $W_a$ to the peripheral edge portion $W_b$ of the wafer W.

In this embodiment, description has been made to an example of providing a step of supplying aqueous alkaline solutions at two different concentrations of oxygen, but this is not restrictive. A step of supplying aqueous alkaline solutions at different three or more concentrations of oxygen may also be provided.

Modified Example

Figure 12:
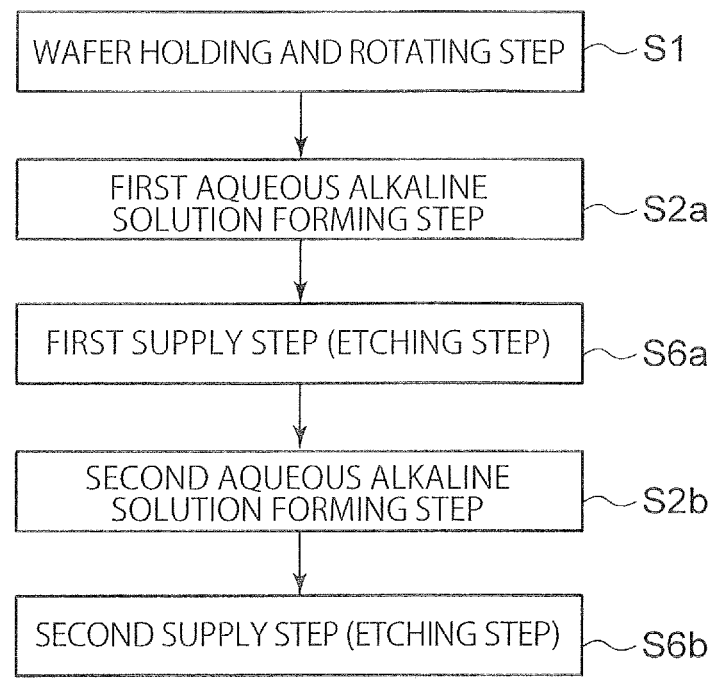
FIG. 12 is a flow chart illustrating a substrate processing method according to a third embodiment of the invention.
Figure 13:
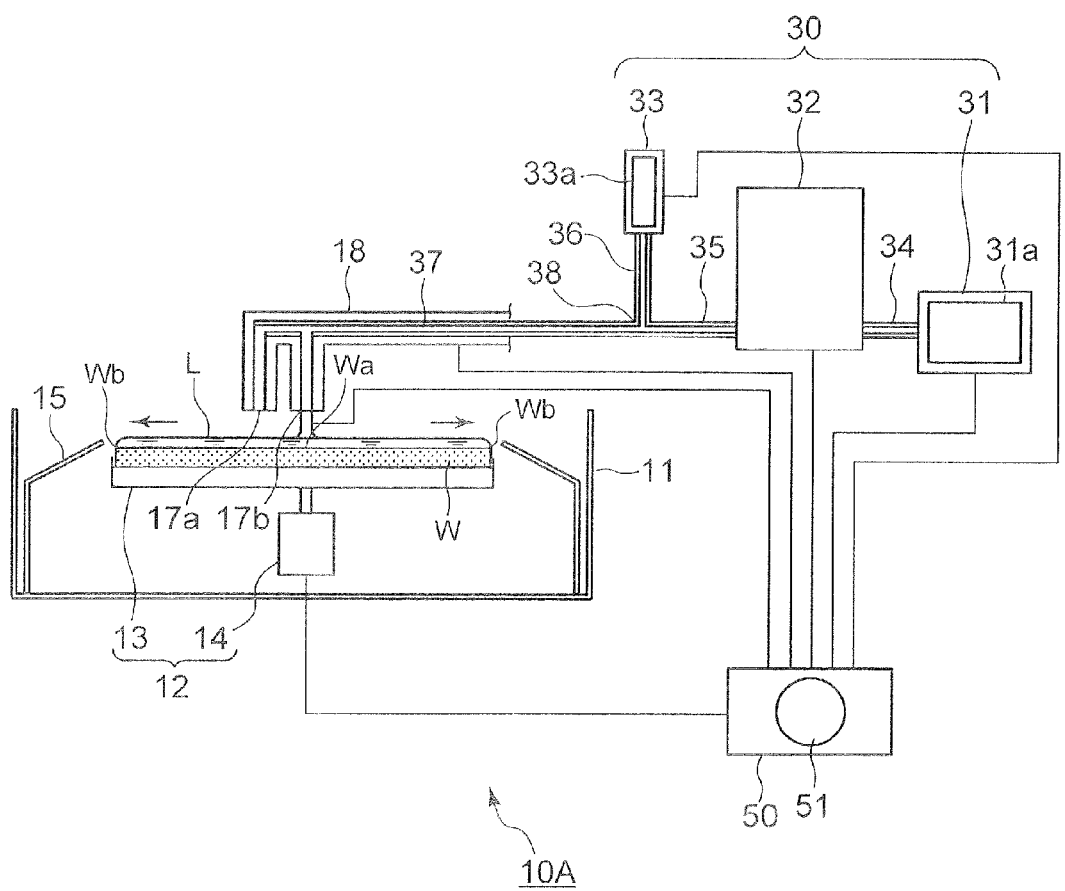
FIG. 13 is a schematic view illustrating a substrate processing apparatus according to a modified example of the third embodiment of the invention.

Then, a modified example of this embodiment is to be described with reference to FIG. 13. FIG. 13 is a schematic view illustrating a modified example of a substrate processing method according to this embodiment. The embodiment illustrated in FIG. 12 is configured to supply aqueous alkaline solutions at a plurality of different oxygen concentrations by one nozzle. However, the modified example illustrated in FIG. 13 is different in that two nozzles 17a and 17b are used as the nozzle, and other configurations are substantially identical with those of the substrate processing apparatus 10 described above (FIG. 1).

In a substrate processing apparatus 10A illustrated in FIG. 13, two nozzles 17a and 17b are included in a nozzle arm 18. The first nozzle 17a serves to supply an aqueous alkaline solution L at a first oxygen concentration, and the second nozzle 17b serves to supply an aqueous alkaline solution L at a second oxygen concentration. Both of the two nozzles 17a and 17b are connected to a common liquid supplying mechanism 30.

In this case, an aqueous alkaline solution L at a first oxygen concentration is first formed by the liquid supplying mechanism 30 (first aqueous alkaline solution forming step) (step S2a).

Subsequently, the first nozzle 17a is moved to above the central portion $W_a$ of the wafer W and an aqueous alkaline solution L at the first oxygen concentration is supplied for a predetermined period (for example, X seconds) from the nozzle 17a to the wafer W (first supply step) (step S6a).

Successively, an aqueous alkaline solution L at a second oxygen concentration is formed by the liquid supplying mechanism 30 (second aqueous alkaline solution forming step) (step S2b).

Subsequently, the second nozzle 17b is moved to above the central portion $W_a$ of the wafer W and the aqueous alkaline solution L at the second oxygen concentration is supplied for a predetermined period (for example, Y seconds) (second supply step) (step S6b). Thus, etching is applied to the wafer W.

As described above, this modified example uses the first nozzle 17a for supplying the aqueous alkaline solution L at the first oxygen concentration and the second nozzle 17b for supplying the aqueous alkaline solution L at the second oxygen concentration are used. Due to such a configuration, when the concentration of oxygen is switched from the first concentration to the second concentration, the aqueous alkaline solution L at the first concentration remaining in the nozzle or in a supply channel is not discharged as it is from an identical nozzle, so that there is less possibility of deteriorating the uniformity of the etching amount within the surface of the wafer W. Further, when the concentration of oxygen is switched from the first concentration to the second concentration, since dummy dispensing (preliminary discharge) of the aqueous alkaline solution L at the first oxygen concentration is not necessary, there is no possibility of lowering the throughput.

In FIG. 13, the two nozzles 17a and 17b are provided to one nozzle arm 18, but this is not restrictive and a nozzle arm for the first nozzle 17a and a nozzle arm for the second nozzle 17b may be provided as separate members.

Figure 14:
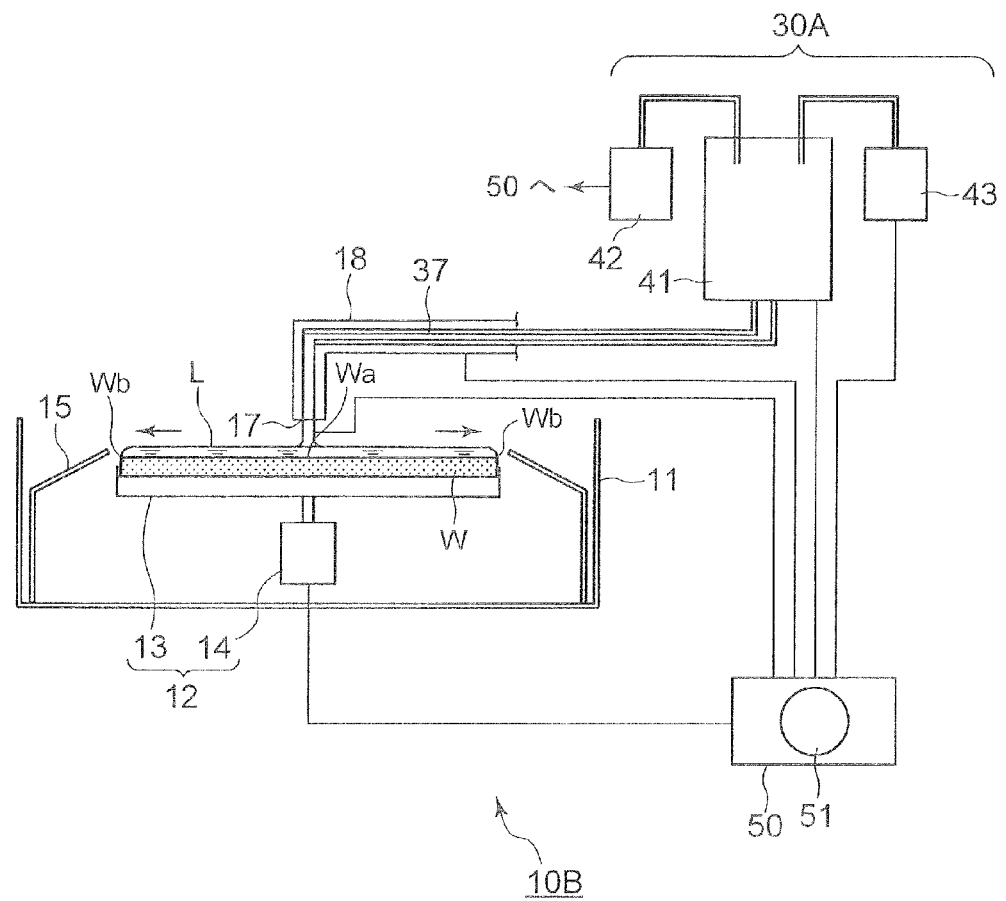
FIG. 14 is a schematic view illustrating a substrate processing apparatus according to another modified example of the third embodiment of the invention.

Then, another modified example of this embodiment is to be described with reference to FIG. 14. FIG. 14 is a schematic view illustrating another modified example of the substrate processing method according to this embodiment. The modified example illustrated in FIG. 14 is different in the configuration of the liquid supplying mechanism and other configurations are substantially identical with those of the substrate processing apparatus 10 (FIG. 1) described previously.

In a substrate processing apparatus 10B illustrated in FIG. 14, a liquid supplying mechanism 30A has a reservoir tank (reservoir unit) 41 for storing an aqueous alkaline solution L, an oxygen supplying mechanism 42 connected to the reservoir tank 41, and an inert gas supplying mechanism 43 connected to the reservoir tank 41.

The oxygen supplying mechanism 42 supplies oxygen bubbles to the aqueous alkaline solution L in the reservoir tank 41 (bubbling), thereby dissolving oxygen into the aqueous alkaline solution L. Further, the inert gas supplying mechanism 43 supplies an inert gas (for example, nitrogen gas) bubbles to the aqueous alkaline solution L in the reservoir tank 41 (bubbling). The liquid supplying mechanism 30A having the reservoir tank 41, the oxygen supplying mechanism 42, and the inert gas supplying mechanism 43 as described above is to be described later with reference to FIG. 18.

In this case, an aqueous alkaline solution L at a first oxygen concentration is formed first by the liquid supplying mechanism 30A (first aqueous alkaline solution forming step) (step S2a), and stored in a reservoir tank 41.

Then, inert gas bubbles are supplied by the inert gas supplying mechanism 43 to the aqueous alkaline solution L in the reservoir tank 41 to cause bubbling. This can remove various gases dissolved in the aqueous alkaline solution L.

Successively, the aqueous alkaline solution L at the first oxygen concentration is supplied for a predetermined period (for example, X seconds) (first supply step) (step S6a).

Subsequently, the controller 50 controls the oxygen supplying mechanism 42 to supply oxygen bubbles to the aqueous alkaline solution L in the reservoir tank 41 thereby dissolving oxygen into the aqueous alkaline solution L to form an aqueous alkaline solution L at a second oxygen concentration (second aqueous alkaline solution forming step) (step S2b). If it is necessary to lower the concentration of oxygen in the reservoir tank 41 when the aqueous alkaline solution L at the second oxygen concentration is formed, an aqueous alkaline solution L in which oxygen is not dissolved is added to the reservoir tank 41.

Subsequently, the aqueous alkaline solution L at the second oxygen concentration is supplied from the nozzle 17 to the wafer W for a predetermined period (for example, Y seconds) (second supply step) (step S6b). Thus, etching is applied to the wafer W.

As described above according to this modified example, since oxygen is dissolved in the aqueous alkaline solution L by supplying oxygen bubbles to the aqueous alkaline solution L stored in the reservoir tank 41, the concentration of oxygen in the aqueous alkaline solution L is controlled easily.

The configuration illustrated in FIG. 13 and configuration illustrated in FIG. 14 may be combined. That is, the liquid supplying mechanism 30 of the substrate processing apparatus 10A illustrated in FIG. 13 may be replaced with the liquid supplying mechanism 30A of the substrate processing apparatus 10B illustrated in FIG. 14.

Figure 15:
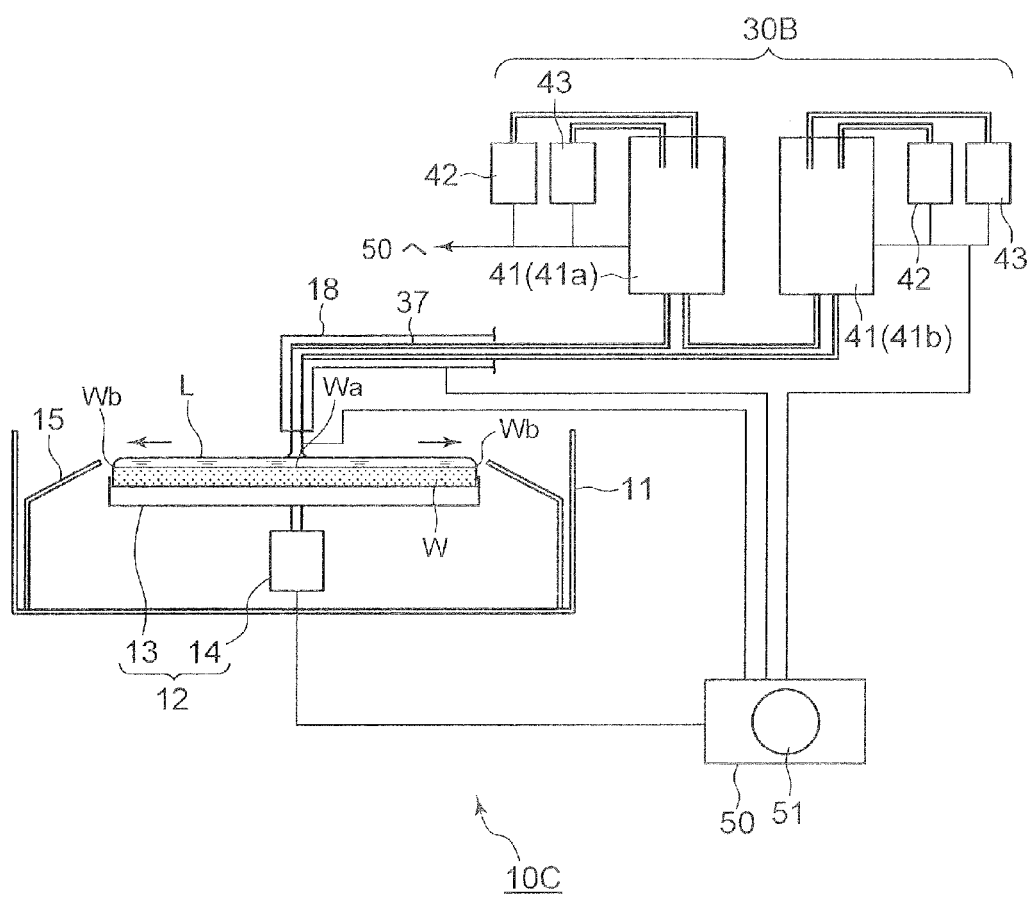
FIG. 15 is a schematic view illustrating a substrate processing apparatus according to a further modified example of the third embodiment of the invention.

Then, a further modified example of this embodiment is to be described with reference to FIG. 15. FIG. 15 illustrates a further modified example of the substrate processing method according to this embodiment. The modified example illustrated in FIG. 15 is different in that the liquid supplying mechanism has two reservoir tanks, and other configurations are substantially identical with those of the substrate processing apparatus 10B described above (FIG. 14).

In a substrate processing apparatus 10C illustrated in FIG. 15, a liquid supplying mechanism 30B has two reservoir tanks (reservoir units) 41a, 41b for storing the aqueous alkaline solution L. Each of the reservoir tanks 41a and 41b are connected with an oxygen supplying mechanism 42 and an inert gas supplying mechanism 43 respectively.

In the two reservoir tanks 41a, 41b, one reservoir tank (first reservoir unit) 41a is adapted to form an aqueous alkaline solution L at a first oxygen concentration and the other reservoir tank (second reservoir unit) 41b is adapted to form an aqueous alkaline solution L at a second oxygen concentration.

In this case, the liquid supplying mechanism 30B first forms an aqueous alkaline solution L at the first oxygen concentration (first aqueous alkali solution forming step) (step S2a) and stores the solution in one reservoir tank 41a. Further, the liquid supplying mechanism 30B forms an aqueous alkaline solution L at the second oxygen concentration (second aqueous alkaline solution forming step) (step S2b) and stores the solution in the other reservoir tank 41b.

Successively, the aqueous alkaline solution L at the first oxygen concentration is delivered from the one reservoir tank (first reservoir unit) 41a and the aqueous alkaline solution L is supplied by the nozzle 17 to the wafer W for a predetermined period (for example, X seconds) (first supply step) (step S6a).

Subsequently, the aqueous alkaline solution L at the second oxygen concentration is delivered from the other reservoir tank 41b and the aqueous alkaline solution L is supplied to the wafer W for a predetermined period (for example, Y seconds) (second supply step) (step S6b). Thus, etching is applied to the wafer W.

As described above according to this modified example, throughput can be improved by using the two reservoir tanks 41a and 41b.

The configuration illustrated in FIG. 13 and the configuration illustrated in FIG. 15 may be combined. That is, the liquid supplying mechanism 30 of the substrate processing apparatus 10A illustrated in FIG. 13 may be replaced with the liquid supplying mechanism 30B in the substrate processing apparatus 10C illustrated in FIG. 15.

Example

Specific examples of this embodiment are to be described with reference to FIG. 16(*a*) to FIG. 16(*d*). The present invention is not restricted to the following descriptions of the examples unless it does not exceed the gist of the invention.

Example 1

First, the wafer W is held horizontally to the placing bed 13 of the substrate holding mechanism 12 and rotated. The rotational speed of the wafer W was set to 1000 rpm.

Successively, an aqueous alkaline solution L in which oxygen was not dissolved (first concentration: 100 ppb or less) was formed by using the liquid supplying mechanism 30 of the substrate processing apparatus 10 illustrated in FIG. 1 and the aqueous alkaline solution L was supplied from the nozzle 17 to the wafer W for a predetermined period (X seconds). Subsequently, the aqueous alkaline solution L at the second oxygen concentration of 3000 ppb was formed and the aqueous alkaline solution L was supplied from the nozzle 17 to the wafer W for a predetermined period (Y seconds) by using the liquid supplying mechanism 30.

The ratio for the periods of supplying the aqueous alkaline solutions L was set as: X second:Y second=1:1.

In this manner, the wafer W was etched by supplying the aqueous alkaline solution L from the nozzle 17 to the wafer W. Then, the etching amount at the surface of the wafer W was measured in a radial direction.

Figure 16:
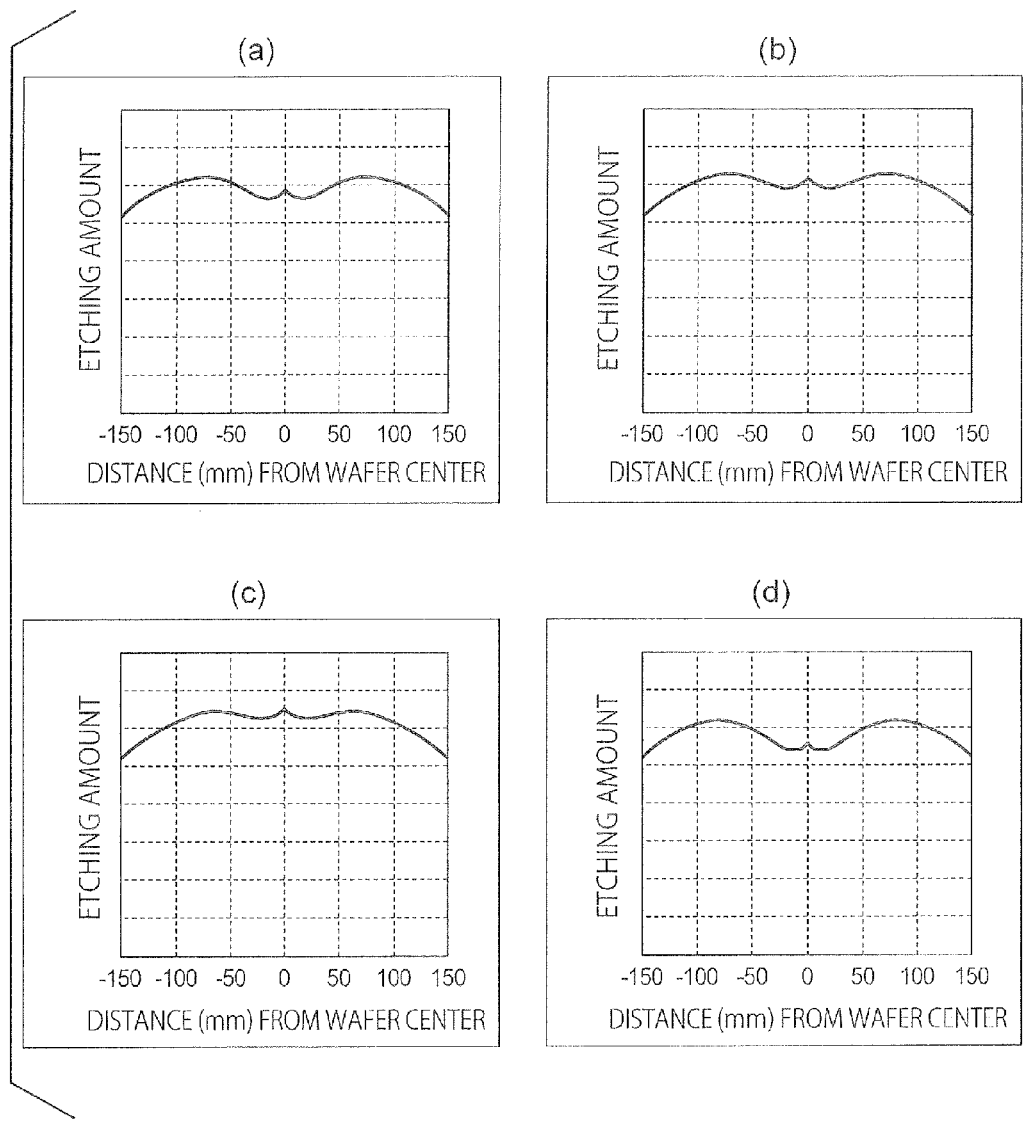
FIG. 16($a$) to FIG. 16($d$) are graphs illustrating the result of measurement for an etching amount at the wafer surface in an example of the third embodiment of the invention.

The result is shown in FIG. 16(*a*). In FIG. 16(*a*), the abscissa represents a distance (mm) from the central portion $W_a$ of the wafer W and the ordinate represents an etching amount (μm).

Example 2

Etching was applied to the wafer W in the same manner as in Example 1 except for setting the ratio as X second:Y second=2:3. Subsequently, the etching amount at the surface of the wafer W was measured in the radial direction. The result is shown in FIG. 16(*b*).

Example 3

Etching was applied to the wafer W in the same manner as in Example 1 except for setting the ratio as X second:Y second=7:3. Subsequently, the etching amount at the surface of the wafer W was measured in the radial direction. The result is shown in FIG. 16(*c*).

Example 4

Etching was applied to the wafer W in the same manner as in Example 1 except for setting the ratio as X second:Y second=3:2. Subsequently, the etching amount at the surface of the wafer W was measured in the radial direction. The result is shown in FIG. 16(*d*).

As illustrated in FIG. 16(*a*) to FIG. 16(*d*), it can be seen that the etching amount applied can be made uniform within the surface of the wafer W by supplying the aqueous alkaline solution L at the first oxygen concentration to the wafer W for a predetermined period (X seconds) and then supplying the aqueous alkaline solution L at the second oxygen concentration to the wafer W for a predetermined period (Y seconds).

That is, the etching amount within the surface of the wafer W can be controlled by changing a ratio between a processing period for the aqueous alkaline solution L at the first oxygen concentration and the processing period for the aqueous alkaline solution L at the second oxygen concentration. In other words, the use of the aqueous alkaline solution L at the first oxygen concentration is associated with a first trend of etching amount while the use of the aqueous alkaline solution L at the second oxygen concentration is associated with a second trend of etching amount. The processing period for the former or the latter, which is intended to be more predominant, should be made longer.

In the same manner, either in the processing step by using the aqueous alkaline solution L at the first oxygen concentration or in the processing step by using the aqueous alkaline solution at the second oxygen concentration, the etching trend in either one of the processing steps can be made more predominant to improve the uniformity of the etching within the surface, by elevating the processing temperature with the aqueous alkaline solution L, increasing the flow rate of the supplied aqueous alkaline solution L, and/or lowering the number of rotation of the wafer W in one of the processing step.

Fourth Embodiment

Figure 17:
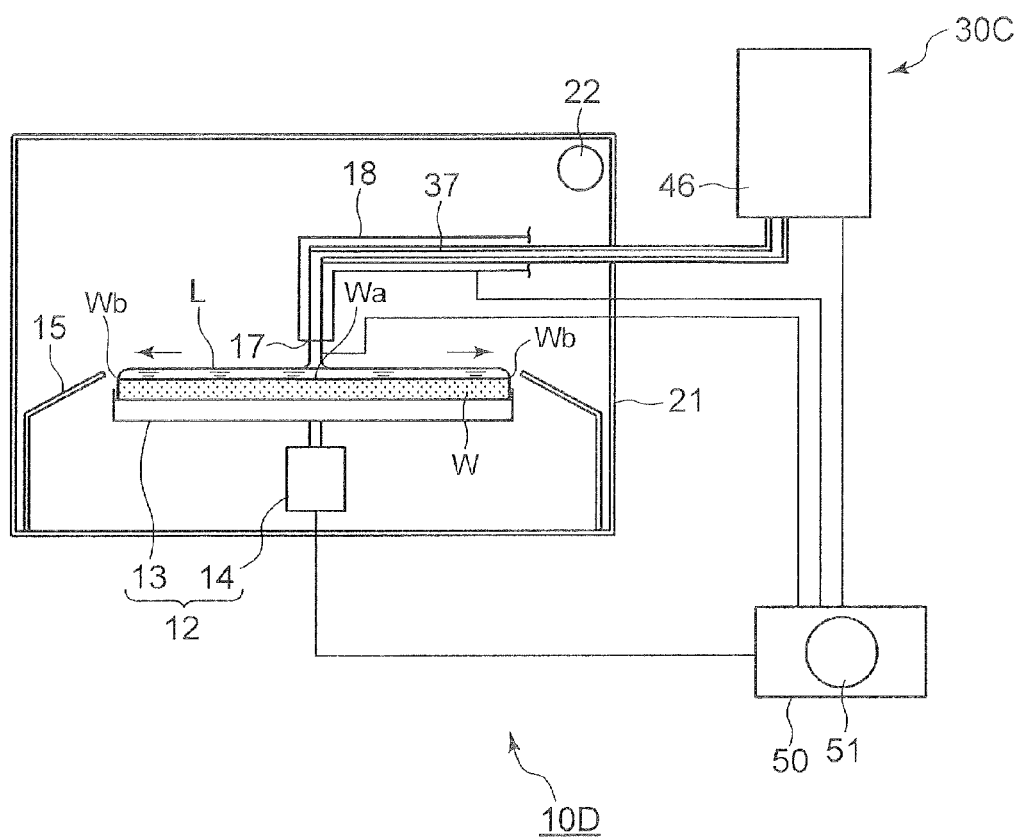
FIG. 17 is a schematic view illustrating a substrate processing apparatus according to a fourth embodiment of the invention.

Then, a fourth embodiment of a substrate processing method, a substrate processing apparatus, and storage medium according to the invention is to be described with reference to FIG. 17. In FIG. 17, identical portions with those in the embodiments described previously carry the same reference numerals for which detailed descriptions are to be omitted.

Configuration of Substrate Processing Apparatus

As illustrated in FIG. 17, a substrate processing apparatus 10D according to this embodiment includes: a substrate holding mechanism 12 for holding a wafer W horizontally and rotating the wafer W; a nozzle 17 disposed above the substrate holding mechanism 12, the nozzle 17 supplying an aqueous alkaline solution L to the wafer W, thereby etching the wafer W; and a liquid supplying mechanism 30C connected to the nozzle 17, the liquid supplying mechanism 30C supplying an aqueous alkaline solution (aqueous solution of potassium hydroxide (KOH)) L to the nozzle 17.

Among these, the substrate holding mechanism 12 and the nozzle 17 are arranged in a tightly closed chamber 21. An inert gas discharging unit 22 for discharging an inert gas (for example, nitrogen gas) to the inside of the chamber 21 is provided in the chamber 21. The inside of the chamber is kept to an inert gas atmosphere by the inert gas discharging unit 22 so as not to intrude oxygen.

Also in this embodiment, the liquid supplying mechanism 30C has a reservoir tank (reservoir unit) 46 for storing an aqueous alkaline solution L. In this case, oxygen is not substantially dissolved in the aqueous alkaline solution in the reservoir tank 46 (first concentration: 100 ppb or less).

Substrate Processing Method Using Substrate Processing Apparatus

Then, the function of this embodiment comprising such a configuration, specifically, a substrate processing method of using the substrate processing apparatus described above is to be described. The following operations are carried out by a controller 50.

First, the wafer W is held horizontally on a placing bed 13 of the substrate holding mechanism 12 and the wafer W on the placing bed 13 is rotated by the rotational mechanism 14. Then, the aqueous alkaline solution L stored in the reservoir tank 46 (not containing oxygen) is passed through a supply pipe 37 and sent to the nozzle 17 by the liquid supplying mechanism 30C.

Subsequently, an aqueous alkaline solution L not containing oxygen is supplied from above the wafer W to the wafer W by the nozzle 17. The aqueous alkaline solution L supplied from the nozzle 17 flows by a centrifugal force to the radial outside of the wafer W and etching is applied to the wafer W. Subsequently, supply of the aqueous alkaline solution from the nozzle 17 is stopped. Thus, etching of the wafer W by the aqueous alkaline solution L is completed.

As described above according to this embodiment, since the inside of the chamber 21 is kept to an inert gas atmosphere during etching, there is no possibility that the aqueous alkaline solution L flowing to the radial outside of wafer W involves oxygen in atmospheric air. This can make the etching amount applied uniform within the surface from the central portion $W_a$ to the peripheral edge portion $W_b$ of the wafer W.

Fifth Embodiment

Figure 18:
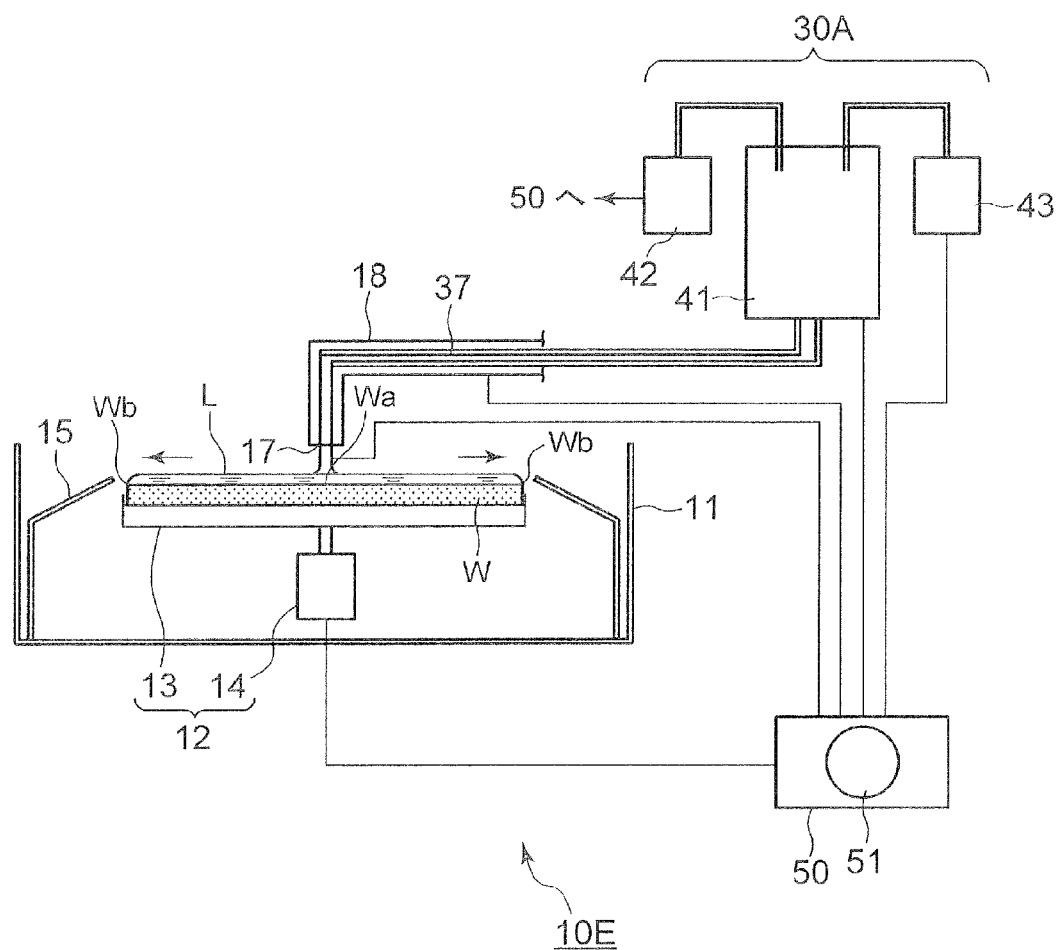
FIG. 18 is a schematic view illustrating a substrate processing apparatus according to a fifth embodiment of the invention.

Then, a fifth embodiment of a substrate processing method, a substrate processing apparatus and a storage medium according to the invention is to be described with reference to FIG. 18. In FIG. 18, identical portions with those in the embodiment described previously carry the same reference numerals for which detailed descriptions are to be omitted.
Configuration of Substrate Processing Apparatus As illustrated in FIG. 18, a substrate processing apparatus 10E according to this embodiment includes: a substrate holding mechanism 12 for holding a wafer W horizontally and rotating the wafer W; a nozzle 17 disposed above the substrate holding mechanism 12, the nozzle 17 supplying an aqueous alkaline solution L (aqueous solution of potassium hydroxide (KOH)) to the wafer W thereby etching the wafer W; and a liquid supplying mechanism 30A connected to the nozzle 17, the liquid supplying mechanism 30A supplying an aqueous alkaline solution L in which oxygen is dissolved to the nozzle 17.

The liquid supplying mechanism 30A has a reservoir tank (reservoir unit) 41 for storing the aqueous alkaline solution L, an oxygen supplying mechanism 42 connected to the reservoir tank 41 and an inert gas supplying mechanism 43 connected to the reservoir tank 41.

The oxygen supplying mechanism 42 supplies oxygen bubbles to the aqueous alkaline solution L in the reservoir tank (bubbling) thereby dissolving oxygen into the aqueous alkaline solution L. The solubility of the aqueous alkaline solution L in the reservoir tank 41 can be controlled, for example, by changing the flow rate of oxygen from the oxygen supplying mechanism 42 or a period of supplying oxygen from the oxygen supplying mechanism 42.

Further, the inert gas supplying mechanism 43 supplies inert gas (for example, nitrogen gas) bubbles into the aqueous alkaline solution L in the reservoir tank 41 (bubbling).
Substrate Processing Method Using Substrate Processing Apparatus Then, the function of this embodiment comprising such a configuration, specifically, a substrate processing method of using the substrate processing apparatus described above is to be described. The following operations are carried out by the controller 50.

In this method, an alkaline aqueous solution L is first stored in the reservoir tank 41 of the liquid supplying mechanism 30A. Subsequently, inert gas bubbles are supplied to the aqueous alkaline solution L in the reservoir tank 41 for a predetermined period (bubbling) by using the inert gas supplying mechanism 43. Thus, various gases dissolved in the aqueous alkaline solution are degassed.

Successively, oxygen bubbles are supplied to the aqueous alkaline solution L in the reservoir tank 41 for a predetermined period (bubbling) by using the oxygen supplying mechanism 42 to dissolve oxygen into the aqueous alkaline solution L. Thus, the concentration of oxygen in the aqueous alkaline solution L in the reservoir tank 41 is set to a predetermined value.

Subsequently, the wafer W is held horizontally on the placing bed 13 of the substrate holding mechanism 12 and the wafer W on the placing bed 13 is rotated by the rotational mechanism 14 (wafer holding and rotating step).

Subsequently, the liquid supplying mechanism 30A supplies the aqueous alkaline solution L at a predetermined concentration of oxygen by way of the supply pipe 37 to the nozzle 17. Then, the nozzle 17 supplies the aqueous alkaline solution L at a predetermined oxygen concentration from above the wafer W to the wafer W for a predetermined period.

The aqueous alkaline solution L supplied from the nozzle 17 flows to the radial outside of the wafer W by a centrifugal force to etch the wafer W (etching step). Subsequently, supply of the aqueous alkaline solution L from the nozzle 17 is stopped. As described above, etching for the wafer W by the aqueous alkaline solution L is completed.

Subsequently, the inert gas supplying mechanism 43 may supply an inert gas to the aqueous alkaline solution L in the reservoir tank 41 to bubble the aqueous alkaline solution L again. This can prevent degradation of the aqueous alkaline solution L.

As described above according to this embodiment, the liquid supplying mechanism 30A has: the reservoir tank 41 for storing the aqueous alkaline solution L; and the oxygen supplying mechanism 42 connected to the reservoir tank 41 the oxygen supplying mechanism 42 supplying oxygen bubbles to the aqueous alkaline solution in the reservoir tank 41 thereby dissolving oxygen. Thus, the oxygen concentration in the aqueous alkaline solution L can be controlled easily. Therefore, the etching amount to the wafer W applied can be made more uniform within the surface.

Further, according to this embodiment, the liquid supplying mechanism 30A has the inert gas supplying mechanism 43 for supplying the inert gas to the aqueous alkaline solution L in the reservoir tank 41 thereby bubbling the aqueous alkaline solution L. Thus, various gases dissolved in the aqueous alkaline solution L can be degassed before dissolution of oxygen into the aqueous alkaline solution L in the reservoir tank 41 by the oxygen supplying mechanism 42. Further, since the inert gas supplying mechanism 43 bubbles the aqueous alkaline solution L in the reservoir tank 41 again after the liquid supplying mechanism 30A has supplied the aqueous alkaline solution L to the nozzle 17 of the liquid supplying mechanism 30A, degradation of the aqueous alkaline solution L can be prevented.

What is claimed is:

1. A substrate processing method for processing a substrate to be processed, the method comprising:
   a step of holding the substrate horizontally and rotating the substrate; and
   a step of supplying an aqueous alkaline etching solution in which oxygen is dissolved previously to the substrate by a nozzle, thereby etching the substrate;
   wherein the nozzle is movable between each of a first position above the central portion of the substrate, a second position outside of the first position, and a third position outside of the second position, and
   the etching step includes
      a first moving supply step of supplying the aqueous alkaline etching solution to the substrate while moving the nozzle from the second position to the first position, and
      a second supply step of supplying the alkaline aqueous etching solution to the substrate after the first moving supply step while moving the nozzle from the third position to the second position,
   wherein a concentration of oxygen in the aqueous alkaline etching solution is 2500 ppb to 4800 ppb.

2. The substrate processing method according to claim 1, wherein
   a step of stopping the nozzle for a predetermined period at the third position is provided between the first moving supply step and the second moving supply step.

3. The substrate processing method according to claim 1, wherein
   the second moving supply step is performed after performing the first moving supply step a plurality of times.

4. The substrate processing method according to claim 1, wherein
   the second moving supply step is performed a plurality of times after performing the first moving supply step.

5. The substrate processing method according to claim 1, wherein
   a combination of the first moving supply step and the second moving supply step is performed a plurality of times.

6. A substrate processing method for processing a substrate to be processed, the method comprising:
   a step of holding the substrate horizontally and rotating the substrate; and
   a step of supplying an aqueous alkaline solution to the substrate by at least one nozzle, thereby etching the substrate;
   wherein the step of etching the substrate includes
      a first supply step of supplying the aqueous alkaline solution at a first oxygen concentration where oxygen is not substantially dissolved for a predetermined period to the substrate, wherein the first concentration is 100 ppb or less in the first supply step, and
      a second supply step of supplying the aqueous alkaline solution at a second oxygen concentration which is larger than the first concentration to the substrate to increase an etching amount in the central portion of the substrate, after the first supply step.

7. The substrate processing method according to claim 6, wherein
   at least one of a period of supplying the aqueous alkaline solution, a flow rate of the aqueous alkaline solution, a temperature when the aqueous alkaline solution is supplied, and a number of rotations of the substrate is different between the first supply step and the second supply step.

8. The substrate processing method according to claim 6, wherein
   the nozzle used in the first supply step and the nozzle used in the second supply step are made different from each other.

* * * * *